(12) United States Patent
Kempe et al.

(10) Patent No.: US 7,902,301 B2
(45) Date of Patent: Mar. 8, 2011

(54) ENCAPSULANT MATERIALS AND ASSOCIATED DEVICES

(75) Inventors: Michael D Kempe, Littleton, CO (US); Prem Thapa, Lima, OH (US)

(73) Assignees: BRP Manufacturing Company, Lima, OH (US); Alliance For Sustainable Energy, LLC, Golden, CO (US)

( * ) Notice: Subject to any disclaimer, the term of this patent is extended or adjusted under 35 U.S.C. 154(b) by 233 days.

(21) Appl. No.: 12/131,211

(22) Filed: Jun. 2, 2008

(65) Prior Publication Data

US 2009/0032101 A1 Feb. 5, 2009

Related U.S. Application Data

(60) Provisional application No. 60/952,766, filed on Jul. 30, 2007.

(51) Int. Cl.
*C08C 19/25* (2006.01)

(52) U.S. Cl. ............ 525/342; 525/326.1; 525/387; 525/328.3; 136/251; 136/259

(58) Field of Classification Search ........... 525/326.1, 525/387, 328.3, 342; 136/251, 259
See application file for complete search history.

(56) References Cited

U.S. PATENT DOCUMENTS

| | | | |
|---|---|---|---|
| 4,385,136 A | 5/1983 | Ancker et al. | |
| 4,550,056 A * | 10/1985 | Pickwell et al. | 428/391 |
| 4,587,140 A | 5/1986 | Johnson | |
| 4,601,935 A | 7/1986 | Metcalf et al. | |
| 4,692,557 A | 9/1987 | Samuelson et al. | |
| 4,749,430 A | 6/1988 | Samuelson et al. | |
| 5,916,934 A * | 6/1999 | Mahmud et al. | 523/215 |
| 6,255,412 B1 | 7/2001 | Wang et al. | |
| 6,323,273 B1 | 11/2001 | Mahmud et al. | |
| 6,777,610 B2 | 8/2004 | Yamada et al. | |
| 6,785,360 B1 | 8/2004 | Annis | |
| 2002/0029799 A1 | 3/2002 | Yoda et al. | |
| 2003/0114350 A1 | 6/2003 | Schmitt et al. | |
| 2003/0184257 A1 | 10/2003 | Nomura et al. | |
| 2004/0028909 A1 * | 2/2004 | Hodgson et al. | 428/413 |
| 2004/0059069 A1 | 3/2004 | Grimm et al. | |
| 2004/0084078 A1 | 5/2004 | Yoshida et al. | |
| 2004/0244316 A1 | 12/2004 | Macuga et al. | |
| 2006/0201544 A1 | 9/2006 | Inoue | |

FOREIGN PATENT DOCUMENTS

| | | |
|---|---|---|
| EP | 1035591 | 9/2000 |
| EP | 1 837 372 * | 9/2007 |
| EP | 1837372 | 9/2007 |
| JP | 60-092379 | 5/1985 |
| JP | 60-250084 | 12/1985 |
| JP | 01-265408 * | 10/1989 |
| JP | 01265408 | 10/1989 |
| JP | 09-298013 | 11/1997 |
| JP | 11-217463 | 8/1999 |
| WO | WO 2006093936 | 9/2006 |

OTHER PUBLICATIONS

M.D. Kempe, G.J. Jorgensen, K.M. Terwilliger, T.J. McMahon, C.E. Kennedy, T.T. Borek, Acetic acid production and glass transition concerns with ethylene-vinyl acetate used in photovoltaic devices, Solar Energy Materials & Solar Cells, 2007, 91:315-329.
G.J. Jorgensen, K.M. Terwilliger, J.A. Delcueto, S.H. Glick, M.D. Kempe, J.W. Pankow, F.J. Pern, T. J. McMahon, Solar Energy Materials & Solar Cells, 2006, 90:2739-2775.
M.D. Kempe, Modeling of rates of moisture ingress into photovoltaic modules, Solar Energy Materials & Solar Cells, 2006, 90:2720-2738.
M.D. Kempe, Control of moisture ingress into photovoltaic modules, 31st IEEE-PVSC, Lake Buena Vista, FL, Jan. 3-7, 2005.
N.G. Dhere, Reliability of PV modules and balance-of-system components, 31st IEEE-PVSC, Lake Buena Vista, FL, Jan. 3-7, 2005.
M.D. Kempe, Rheological and mechanical considerations for photovoltaic encapsulants, 2005 DOE Solar Energy Technologies Program Review Meeting, Denver, CO, Nov. 7-10, 2005.
M.D. Kempe, Module encapsulant diagnostic and modeling, 2004 DOE Solar Energy Technologies Program Review Meeting, Denver, CO, Oct. 25-28, 2004.

* cited by examiner

*Primary Examiner* — Ling-Siu Choi
(74) *Attorney, Agent, or Firm* — Buchanan Nipper

(57) ABSTRACT

Compositions suitable for use as encapsulants are described. The inventive compositions include a high molecular weight polymeric material, a curing agent, an inorganic compound, and a coupling agent. Optional elements include adhesion promoting agents, colorants, antioxidants, and UV absorbers. The compositions have desirable diffusivity properties, making them suitable for use in devices in which a substantial blocking of moisture ingress is desired, such as photovoltaic (PV) modules.

29 Claims, 7 Drawing Sheets

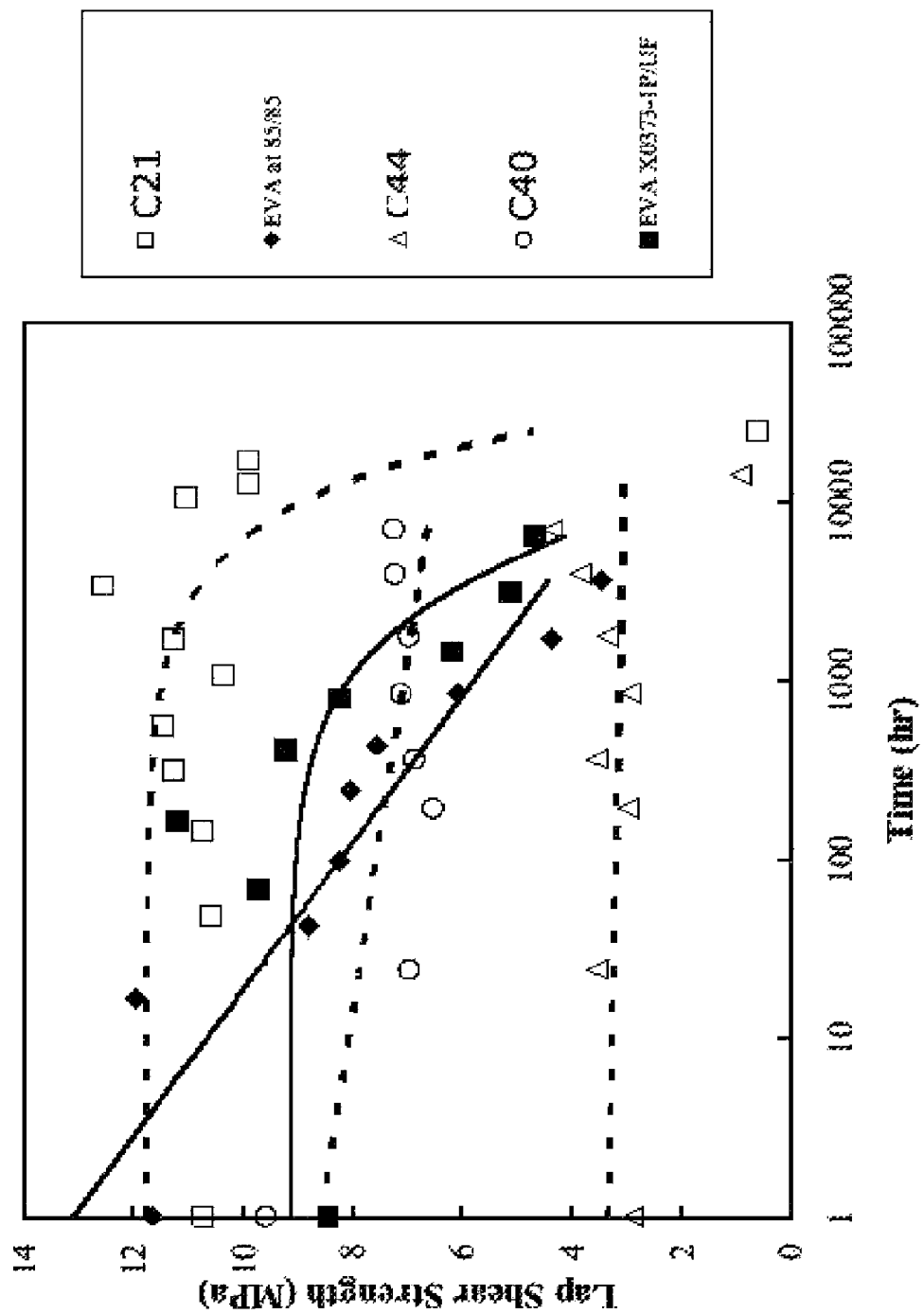
Figure 3. Lap shear adhesion as a function of exposure to 85°C and 85% RH.

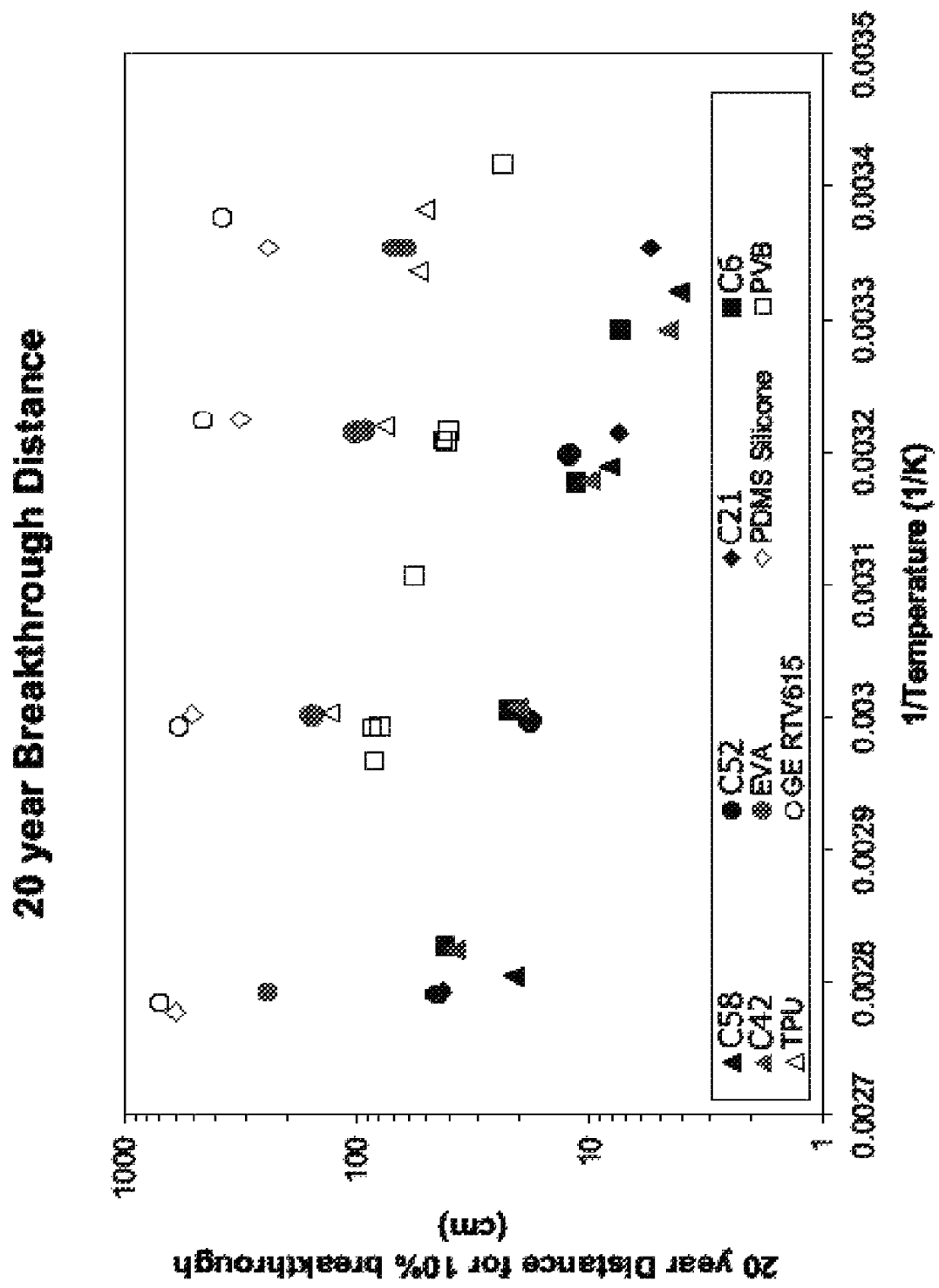
Figure 4. Breakthrough time analysis.

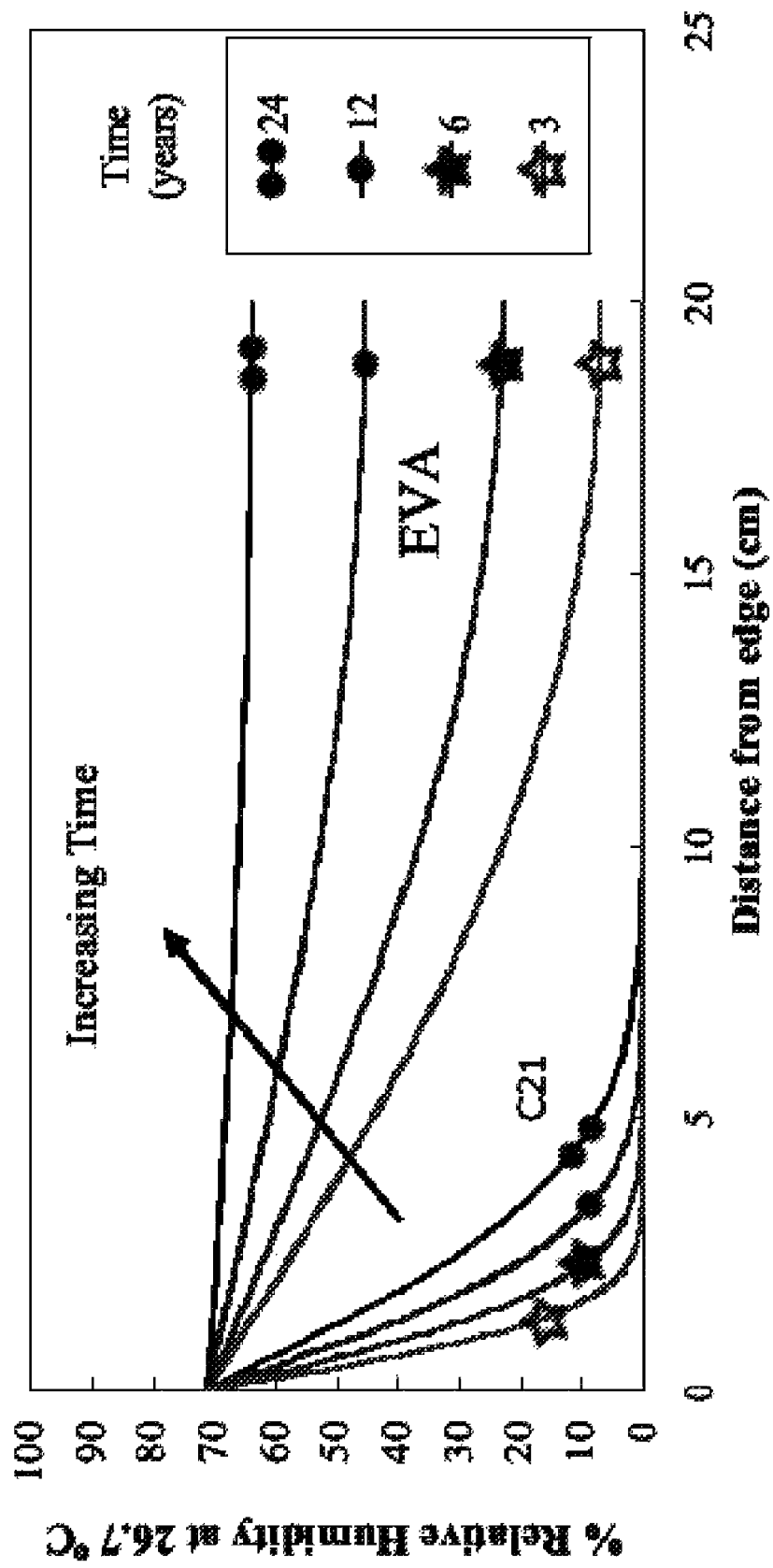
Figure 5. 1-D moisture ingress model analysis.

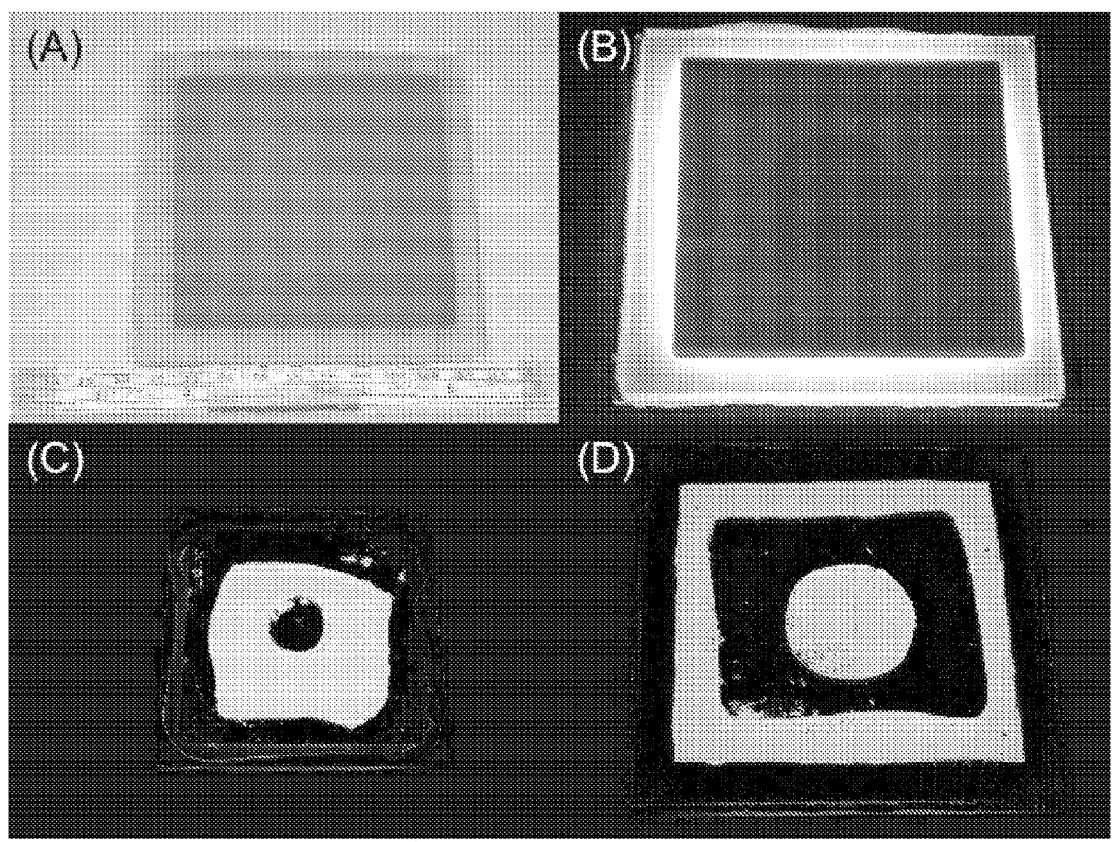
Figure 6. Photographs of 800Å thick aluminum films on 10.2X10.2X0.227mm glass plates after about 1000 h exposure to 85°C and 85% RH.

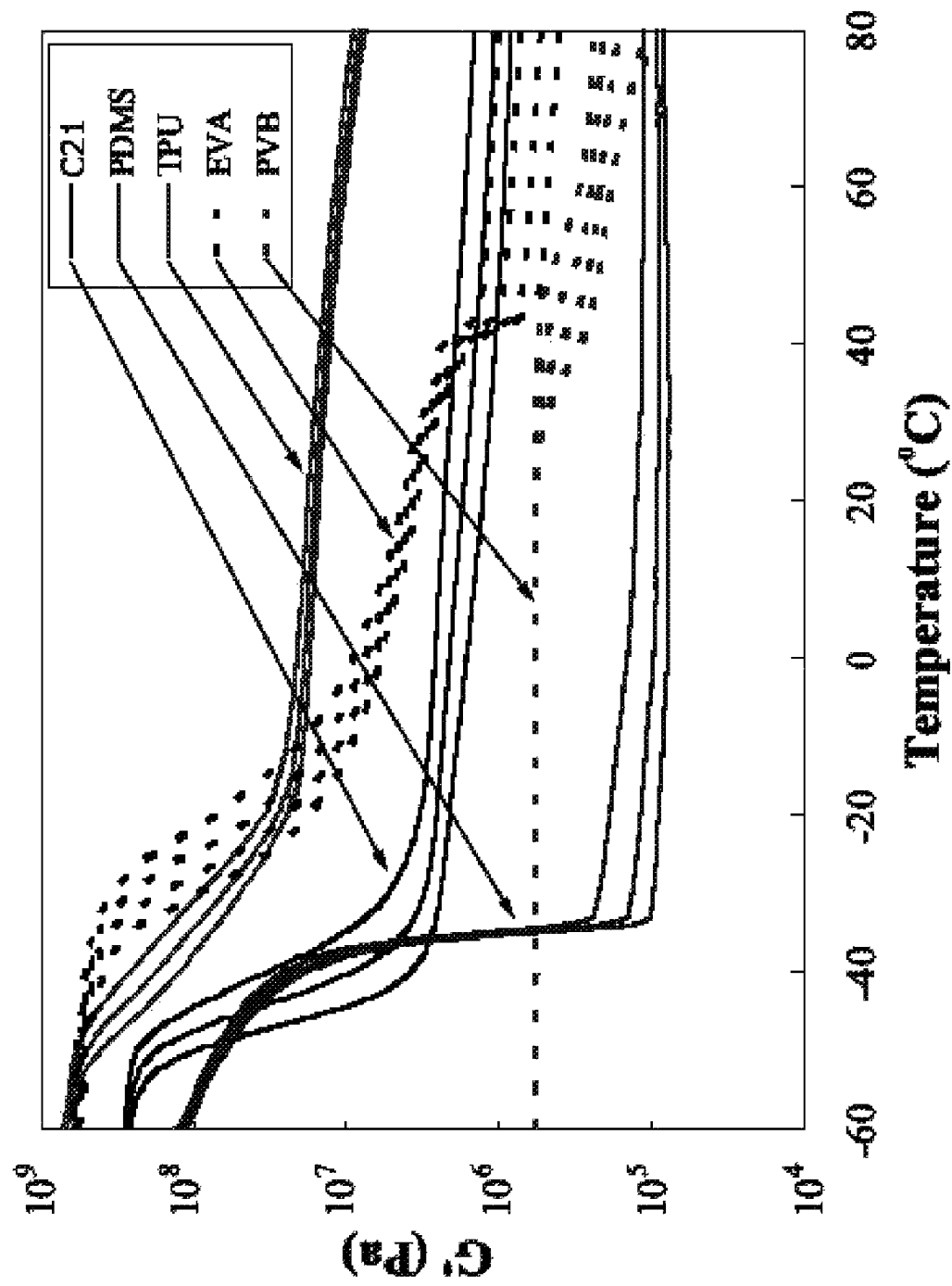
Figure 7. Storage modulus as a function of temperature, while cooling the samples, for various encapsulant materials.

ENCAPSULANT MATERIALS AND ASSOCIATED DEVICES

CROSS-REFERENCE TO RELATED APPLICATION

This application claims priority to U.S. Provisional Application No. 60/952,766, filed on Jul. 30, 2007, the entire contents of which are hereby incorporated by reference into this disclosure.

CONTRACTUAL ORIGIN

The United States Government has rights in this invention under Contract No. DE-AC36-99GO10337 between the United States Department of Energy and the National Renewable Energy Laboratory, a Division of the Midwest Research Institute.

FIELD

The invention relates generally to the field of encapsulant materials and devices in which such materials are used. Exemplary embodiments of the invention are particularly well-suited for use in photovoltaic devices, including solar cell modules.

BACKGROUND

Encapsulant materials are used in a variety of applications to isolate components, areas, or other materials from potentially stressful conditions that can adversely affect the performance of a device. For example, the performance of photovoltaic (PV) modules may decrease over time as water penetrates the module and corrodes the metallic components essential for module function. In the absence of water, corrosion occurs relatively slowly because by-products are less able to diffuse away from a surface to allow the corrosion process to progress. Furthermore, water is known to help catalyze some oxidative reactions.

The PV industry has long-recognized the dramatic effect that corrosion has on module performance. Today, PV modules typically include a polymeric encapsulant material to isolate the silicon components from the ever-present potentially adverse conditions created by various sources of water, including rain, snow, and condensation. The isolation created by the encapsulant protects the PV components from the potential for corrosion and provides additional benefits, including mechanical support, electrical insulation and protection from mechanical damage.

Polymeric encapsulants provide the desired isolation by bonding to a surface and limiting access to the protected areas and/or components. For example, encapsulants used in PV modules are typically bonded to one or more glass sheets to isolate the solar cells, or cell strings, from water in the module's environment. The ability of a polymeric material to protect a surface is thus highly dependent on its ability to bond to a surface and limit access to corrosion sites. Therefore, a strong correlation exists between corrosion protection and adhesive strength.

The dominant encapsulant used in the PV industry is based on a random copolymer consisting of about 67 wt % polyethylene and 33 wt % poly vinyl acetate. Polyethylene was chosen because it is a very simple and inexpensive polymer. When used alone, however, it is typically an opaque or translucent (depending on the polymerization conditions) semicrystalline polymer with a modulus too high to mechanically protect a PV device. Poly vinyl acetate is a transparent, amorphous polymer, but it has a glass transition temperature (Tg) of about 35° C., making it too brittle and/or noncompliant under typical environmental exposure. Therefore, a small amount of vinyl acetate is added to polyethylene to break up the crystallites, producing a semicrystalline, highly transparent material. Typically, 33 wt % vinyl acetate is copolymerized with ethylene to get a good mix of properties such as a high optical transmission and a low Tg.

Over the last several decades, EVA has emerged as the dominant encapsulant material used in PV devices. The adoption of EVA as a de facto standard occurred not because it had the best combination of properties, but because it was inexpensive and readily available. Early modules constructed with EVA demonstrated severe failure within a few years of putting the modules in use because of yellowing of the encapsulant. Improvements to EVA have been developed, including formulations with antioxidant and ultraviolet (UV) absorbers, that provide encapsulant materials that will not significantly yellow over the 20- to 30-year lifetime of a module.

Despite these improvements, EVA still has several drawbacks that affect its performance as an encapsulant material, particularly in PV modules. For example, EVA suffers from non-ideal mechanical and thermal properties, a high diffusivity for water, and acetic acid by-product production. Furthermore, the newer thin-film technologies that are rapidly being developed in the PV industry may be more sensitive to the shortcomings of EVA. As crystalline silicon wafers become thinner, the mechanical properties of EVA may also prove insufficient.

Furthermore, EVA was designed to be used on the front side of cells where high light transmission is required. It is also routinely used on the back side of cells where light transmission is not necessary. In these applications, a white sheet of Tedlar (or another reflective material) is commonly laminated to the back to improve performance by reflecting back the light that initially shines between the cells. This PV module construction method is common because sufficient research into inexpensive non-transparent alternatives has not produced adequate materials that the industry trusts. When the requirement for optical transmission is removed, the use of a much wider variety of alternative encapsulant materials becomes feasible.

The PV industry, generally speaking, is under significant pressure to reduce the cost of manufacturing PV modules. Before PV modules—and the renewable energy they deliver—can enjoy widespread adoption, the manufacturing process must be refined to a point at which the product, PV modules, has desirable price points as compared to conventional energy sources. In this current environment, there is great interest in new technologies that realize efficiencies in the module manufacturing process. Encapsulants, as a component in PV modules, provide an opportunity to realize efficiencies in the module manufacturing process and overall module cost. An encapsulant providing even a minimal cost savings is expected to be well-received in the current environment, particularly if the encapsulant also provides beneficial technical properties.

As the ability to isolate components and areas from potentially adverse conditions is not absolute, there is a continuing need for improved encapsulant materials. The PV industry currently has a particularly well-defined need for such improved materials.

SUMMARY OF EXEMPLARY EMBODIMENTS

The invention includes compositions and devices that include the compositions. Brief summaries of various exemplary embodiments appear below.

Compositions suitable for use as encapsulants are described. A composition according to exemplary embodiments includes an effective amount of a high molecular weight polymeric material (i.e., an amount sufficient to produce an uncured material with acceptably low tack); an effective amount of a curing agent; a coagent; an inorganic compound; and an effective amount of a coupling agent. An optional adhesion promoting agent can also be included.

A composition according to one exemplary embodiment that is particularly well-suited for use as an encapsulant in PV modules comprises an effective amount of ethylene-propylene diene monomer copolymer (EPDM) rubbers; an effective amount of a radical producing curing agent, such as a peroxide or azide; an effective amount of an antioxidant; an inorganic compound; a coagent and an effective amount of a coupling agent.

A composition according to another exemplary embodiment comprises an effective amount of a high molecular weight polymeric material; an effective amount of a curing agent; a coagent; an inorganic compound; an effective amount of a coupling agent; and an effective amount of an adhesion promoting agent.

A composition according to another exemplary embodiment comprises a high molecular weight polymeric material in an amount from about 40 wt % to about 95 wt % of the total composition; a curing agent in an amount from about 0.1 to about 3 wt % of the total composition; a coupling co-agent in an amount from about 0.09% to about 0.5% by weight of the total composition, an inorganic compound in an amount up to about 35 wt % of the total composition; and a silane-based adhesion promoting agent in an amount from about 0.05 wt % to about 2 wt % of the total composition.

Compositions according to the invention can be used in any device in which a need exists to isolate an area and/or component from another area and/or component, such as an environment that presents potentially adverse conditions. Exemplary compositions are particularly well-suited for use in PV devices, such as PV modules. Accordingly, PV devices including a composition according to the invention are also described.

A PV device according to one exemplary embodiment comprises a PV module. An exemplary PV module includes a glass plate; photovoltaic cell circuitry; and an encapsulant composition according to the invention bonded to a portion of the glass plate and encapsulating at least a portion of the photovoltaic cell circuitry. Various optional components can also be included, such as a second glass plate (e.g., a back plate), a transparent encapsulant, and a backing containing a colorant such as a titanium dioxide. A frame surrounding the glass plate or plates can also be included. It may also be constructed without the use of glass to form a flexible panel.

Additional understanding of the invention can be obtained with review of the detailed description of exemplary embodiments, below, and the appended drawings illustrating various exemplary embodiments.

BRIEF DESCRIPTION OF THE DRAWINGS

FIG. 3 graphically illustrates the results of a lap shear adhesion analysis of several claimed and control compositions. Various exemplary compositions according to the invention (designated as 'Cx'; formulation information for these compositions is presented in Table I where 'x' corresponds to the composition number) are compared with control EVA compositions.

FIG. 4 graphically illustrates a comparison of breakthrough times for various claimed and control compositions. In a module constructed using an impermeable front- and back-sheet, the breakthrough time represents the distance to which moisture would penetrate a module from the sides at a given temperature (1/K).

FIG. 5 graphically illustrates results of moisture ingress modeling comparing a composition (C21) according to an exemplary embodiment to a control composition (EVA). The model assumes constant external conditions of 26.7° C. and 71% RH which represent average conditions for a rack mounted PV system in Florida.

FIG. 6 includes photographs of laminant structures that include either a claimed or a control composition following about 1000 h exposure to 85° C. and 85% RH. All samples were laminated to another glass plate using encapsulant material located around the edge and in the center with an air gap in between (see M. D. Kempe, G. J. Joregensen, K. M. Terwilliger, T. J. McMahon, C. E. Kennedy, T. T. Borek, Acetic Acid Production and Glass Transitions Concerns with Ethylene-Vinyl Acetate used in Photovoltaic Devices, *Solar Energy Materials & Solar Cells,* 91, 315-329 (2007); see also G. J. Jorgensen, K. M. Terwilliger, J. A. DelCueto, S. H. Glick, M. D. Kempe, J. W. Pankow, F. J. Pern, T. J. McMahon, *Solar Energy Materials & Solar Cells,* 90, 2739-2775 (2006)). Back-lit photos were taken using a light table in a darkened room to highlight areas where the aluminum films were oxidized. (A) Front-lit sample including exemplary Composition 21, an exemplary composition according to the invention (formulation details listed in Table I). (B) Back-lit sample including exemplary Composition 21. (C) Back-lit Dow Corning 700 polydimethy silicone sample. (D) Back-lit EVA sample.

FIG. 7 graphically illustrates the results of an analysis of storage modulus for various claimed and control compositions. Compositions analyzed include Composition 21 (C21) (an exemplary composition according to the invention; formulation details listed in Table I), Polydimethyl silicone (PDMS), Thermoplastic Polyurethane (TPU), Ethylene-Vinyl Acetate (EVA), and Polyvinyl butraldehyde (PVB).

DETAILED DESCRIPTION OF EXEMPLARY EMBODIMENTS

Figure 1:
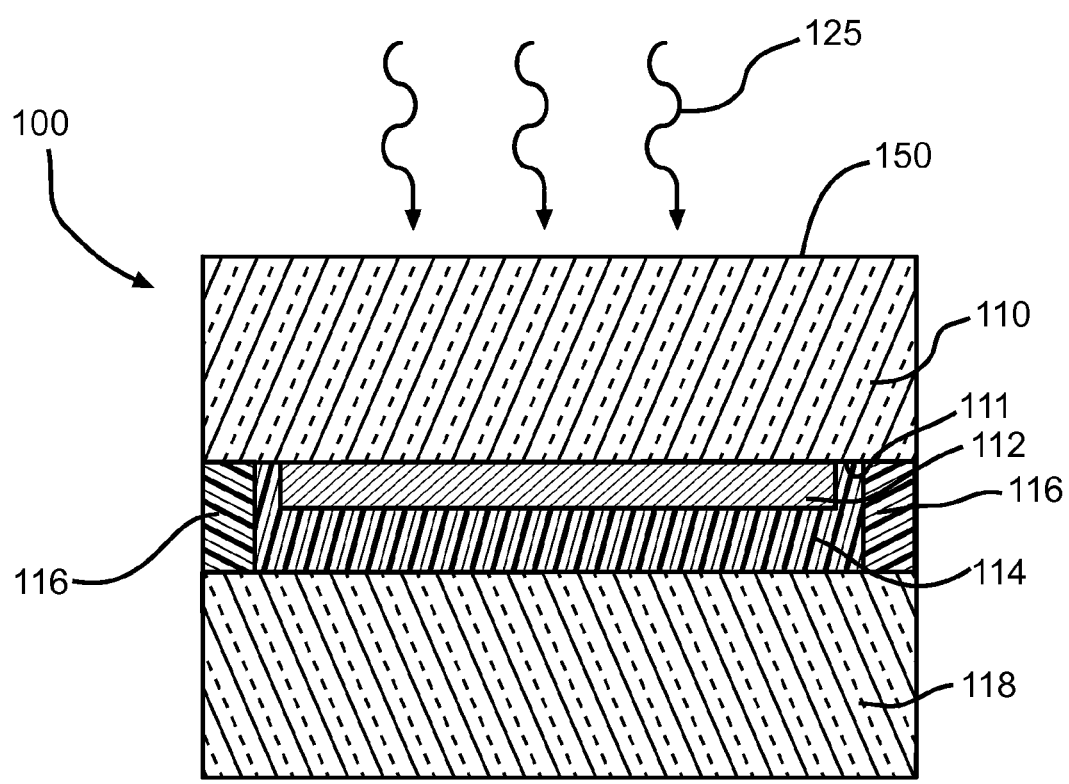
FIG. 1 is a sectional view of a solar module according to an exemplary embodiment.

The following detailed description and the appended drawings describe and illustrate exemplary embodiments of the invention solely for the purpose of enabling one of ordinary skill in the relevant art to make and use the invention. As such, the description and illustration of these embodiments are purely exemplary in nature and are in no way intended to limit the scope of the invention, or its protection, in any manner.

Exemplary Embodiments

The currently claimed compositions include an effective amount of a high molecular weight polymeric material; an effective amount of a curing agent; an inorganic compound; and an effective amount of a coupling agent. The inventors have determined that compositions that include these elements possess desirable characteristics that render the compositions suitable for use as an encapsulant in a variety of applications, such as in the manufacture of PV modules. A skilled artisan will be able to determine appropriate amounts of each element to include in a particular composition based on various considerations, including the intended use of the composition. The exemplary compositions described herein provide examples of specific compositions that the inventors have determined are suitable for particular applications. As such, they may provide guidance on the selection of appropriate amounts for each element.

The compositions can include various optional elements, such as an adhesion promoting agent, a colorant, an antioxidant, such as a radical scavenger, a UV absorber, and one or more processing aids. Some exemplary embodiments of the compositions include one of these optional elements, others include two of these optional elements, and others include all of these optional elements. A skilled artisan will be able to select which of these optional elements, if any, to include in a particular composition based on various considerations, including the intended use of the composition and its desired properties.

As is generally known in the chemical arts, a coagent functions to enhance the cure but may also act to enhance coupling to filler material and to enhance adhesion to external surfaces. Conversely, an adhesion promoting agent (such as a trialkoxy silane) may also interact with the curative and hence act as a coagent though they are generally referred to as adhesion promoting agents. Processing aids improve the flow characteristics of a polymeric material and may hence improve the adhesion to external surfaces. Processing aids may include low molecular weight polymers that are not necessarily structurally different from the base resin. In the context of this application for patent, these terms specify a specific function, but the exact materials chosen may also serve multiple roles. For example, zinc diacrylate functions principally as a coagent but also promotes adhesion to external surfaces and couples to the inorganic filler.

The inventors have determined that the high molecular weight polymeric material is advantageously present in the composition in an amount from about 40 wt % to about 95 wt % of the total composition. This range provides the composition with the ability to be formed into a sheet and represents a range of values that confer optimized flow and adhesion properties on the composition. Excessive high molecular weight polymeric material produces a composition with unsatisfactory adhesion properties, while an insufficient amount of the high molecular weight polymeric material can produce a composition with excessive tackiness. A range of from about 60 wt % to about 80 wt % of the total composition is considered more advantageous. An amount of about 65 percent by weight of the total composition is considered particularly advantageous for compositions intended to be used in PV modules at least because when used with appropriate fillers, stabilizers, and liquid components it provides a balance between low tackiness, good adhesion and processability.

The inventors have determined that the inclusion of a high molecular weight polymeric material is critical to the overall performance and desirable handling characteristics of the compositions according to particular aspects of the invention. The use of an intermediate weight polymeric material does not achieve the desired balance between low tackiness and good adhesion properties.

Any suitable high molecular weight polymeric material can be used in the claimed compositions, and the specific high molecular weight polymeric material selected for a particular composition will depend on various considerations, including, cost, ability to crosslink effectively, phase transitions, mechanical moduli, side reactions, processability, ability to reduce corrosion, material diffusivity, moisture barrier properties, electrical insulative properties, and environmental stability.

The inventors have determined that ethylene propylene (EP) polymeric materials are suitable for use in the claimed compositions. EP materials comprising a randomly polymerized mixture of individual units of ethylene and propylene are considered particularly advantageous at least because of their low cost, inherent chemical stability, low glass transition temperatures, and good electrical insulation. EP materials that are terpolymerized with at least one diene molecule, thereby forming an Ethylene Propylene Diene Molecule (EPDM), are considered particularly advantageous for use in compositions intended to be used in PV modules at least because their inclusion can eliminate the melting transition and the associated crystalline phase reducing moduli changes associated with temperature changes, and it also improves the cross-linkability of the elastomer using radical producing chemistries. EPDM materials have a low glass transition temperature (~−50° C.), which makes the behavior of these materials more predictable under extreme conditions. Furthermore, the inventors have determined that EPDM materials have relatively low moisture permeation rates, which will significantly reduce moisture ingress in photovoltaic modules with glass on the front and back.

When using EPDM, a skilled artisan will be able to select an appropriate diene molecule based on various considerations, including cost, reactivity, stability, and its effect on phase transitions and mechanical moduli. The inventors have determined that ethylidene nobornene, dicyclopentadiene, and combinations thereof are suitable diene molecules for EPDM materials used in the claimed compositions.

Both EP and EPDM materials are considered advantageous for use in compositions according to the invention intended for use in photovoltaic modules at least because their properties allow a single layer to replace a second layer of EVA and the backsheet film that is typically included in modules according to current conventional designs. This substitution of a single layer of material for two components of a conventional module provides a potential for cost savings in the manufacturing of photovoltaic modules. Indeed, the inventors currently believe that the use of compositions according to the invention that include EP or EPDM materials can potentially save at least $8.00 per square meter in the cost of materials in the manufacturing of photovoltaic modules, as compared to current conventional designs and methods.

The inventors have determined that the curing agent is advantageously present in the composition in an amount from about 0.1 to about 3 percent by weight of the total composition. This range provides the composition with the ability to rapidly cross-link into a form that will not flow in use and that will remain well adhered to the surface. An amount of about 0.5 to 1 percent by weight of the total composition is considered particularly advantageous for compositions intended to be used in PV modules at least because the amount provides a balance between rapid crosslinking, good adhesion and the desire to reduce cost and avoid the potential to form bubbles.

Any suitable curing agent can be used in the claimed compositions, and the specific curing agent selected for a particular composition will depend on various considerations, including decomposition temperature and kinetics, cost, volatility, and storage longevity. The inventors have determined that radical producing curing agents are advantageous for use in the claimed compositions at least because of their high effectiveness at a relatively low cost, ease of use, and stability. Peroxide curing agents are considered particularly advantageous at least because of their well-characterized nature, effective production of free radicals, and ready availability. Examples of suitable peroxide curing agents include dialkyl peroxides, diacyl peroxides, peroxyesters and peroxy carbonates, such as 2,5-Di(t-butylperoxy)-2,5-dimethylhexane (CAS# 78-63-7, Sold by Atochem of Buffalo, N.Y. under the trademark "LUPERSOL 101"), 1,1-bis(t-butyl peroxy) 3,3,5-trimethyl cyclohexane (CAS# 6731-36-8, sold by Akrochem of Akron Ohio under the trademark "Akrochem TMC-40"), and O,O-t-Butyl-O-(2-ethylhexyl) mono-peroxycarbonate (sold by Atochem of Buffalo, N.Y. under the trademark "LUPERSOL TBEC"). Azo based curing agents, such as azobisisobutyronitrile (AIBN), are also considered suitable for use in the claimed compositions.

The inventors have determined that the inorganic compound is advantageously present in the composition in an amount from about 1 to about 25 percent by weight of the total composition. This range provides the composition with reduced cost, better toughness, desired color, and reduced moisture permeation. A range of between about 1 wt % and about 12 wt % is also considered suitable for achieving at least one of these desirable attributes. An amount of about 3 percent by weight of the total composition is considered particularly advantageous for compositions intended to be used in PV modules because this amount provides a balance between cost, toughness and color and the desire to produce a material that will maintain good adhesion and be easy to process.

Any suitable inorganic compound can be used in the claimed compositions, and the specific inorganic compound selected for a particular composition will depend on various considerations, including cost, ability to adhere to the polymer matrix, color, effect of impurities, potential chemical reactivity, and affect on moisture permeation. The inventors have determined that silica compounds are advantageous for use in the claimed compositions at least because of their ready availability and wide-spread acceptance as filler materials. Examples of suitable inorganic compounds for use in the claimed compositions include silicates, talc, carbonates, titania, carbon black, barium sulphate, clay modified with coupling agent, molecular sieves, silica gel, CaO, MgO. A skilled artisan will be able to select an appropriate inorganic compound from these and other suitable examples based on various considerations, including the property desired to be optimized (composition toughness, cost, color, etc.).

The inventors have determined that an adhesion promoting agent is advantageously present in the composition in an amount from about 0.05 wt % to about 2 wt % of the total composition. This range provides the composition with good adhesion to a wide variety of surfaces. An amount of about 0.1 wt % to 0.3 wt % of the total composition is considered particularly advantageous for compositions intended to be used in PV modules at least because the amount provides a balance between cost and the desire to maintain good adhesion. The inventors have determined that silane compounds are advantageous for use in the claimed compositions at least because of their ready availability and wide-spread acceptance as adhesion promoting agents. Examples of suitable silane compounds for use in the claimed compositions include γ-Glycidoxypropyltrimethoxysilane, γ-Methacryloxypropyltrimethoxysilane, or vinyl tri(2methoxy-ethoxy)silane (sold by Akrochem of Akron Ohio as Akrosorb 9728). Silane a-172 is also considered suitable for use in the claimed compositions.

Any suitable coupling coagent can be used in the claimed compositions, and the specific coupling coagent selected for a particular composition will depend on various considerations, including cost, activity, reactivity toward radicals, effect on adhesion, compatibility with the other rubber components. The coupling coagent need only have a degree of unsaturation (e.g., at least one double bond) to promote favorable interactions with radicals.

Some coupling coagents can be selected that provide the desired coupling function as well as an adhesion promotion function. While some exemplary embodiments include a separate adhesion promoting agent, compositions that include appropriately selected coupling agents can achieve the functions of both the required coupling agent and the optional adhesion promoting agent without adding an additional element to the composition, which may prove beneficial (e.g., by simplifying the composition manufacturing process). The inventors have determined that diacrylates, such as zinc diacrylates, provide both coupling and adhesion promoting functions for the claimed compositions. The inventors have determined that, when included, coupling coagents are advantageously present in the composition in an amount up to about 30% by weight of the total composition.

As mentioned above, the claimed compositions can also include various optional components. For example, processing aids can be included and, indeed, are considered advantageous for applications in which adhesion and the ability to bond to a surface is considered important because improved flow characteristics can lead to improved adhesion. For example, in PV cells, the ability of the encapsulant to bond to a surface is considered important because it is understood in the art that the ingress of moisture into the module correlates with module failure and that the ability of the encapsulant to bond to a surface is directly related to its ability to exclude moisture from the protected areas and/or components. At least for this reason, the inclusion of processing aids which lead to better adhesion are considered advantageous for compositions intended to be used in PV modules.

The inventors have determined that, when included, oils and low molecular weight polymer based processing aids are advantageously present in the composition in an amount up to about 50% by weight of the total composition. This range provides the composition with desirable adhesiveness without significantly affecting the other properties of the composition or making it overly difficult to handle (e.g., due to excessive tackiness). A range of from about 5 to about 25% by weight of the total composition is considered more advantageous. The inventors have determined that, for compositions intended to be used in PV modules in which the composition will be bonded to a glass sheet, an amount of about 5% by weight of the total composition provides desirable adhesiveness without rendering the composition excessively tacky.

Any suitable processing aids can be used in the claimed compositions, and the specific processing aid(s) selected for a particular composition will depend on various considerations, including the materials to which the composition is intended to be bonded. The inventors have determined that low molecular weight polymeric materials that serve to improve flow at high temperatures or cure without adversely affecting tack at low temperatures, such as polyacrylates, polyesters, EPDM (trilene), polybutene (indopol), aliphatic fatty acids, hydrocarbon resin, such as KEP-570F available from Kumho Polychem Co. of Korea, and mixtures thereof, are advantageous for use in the claimed compositions at least because of their ready availability and ease of handling. Examples of suitable processing aids for use in the claimed compositions include isobutylene/butene copolymer liquid commercially available under the trade designation "INDOPOL™ H300" from Amoco Oil Co. of Chicago, Ill., and liquid ethylene-propylene-dicyclopentadiene polymer commercially available under the trade designation Trilene®

67 from Chemtura of Middlebury, Conn. A colorant can also be included in the claimed compositions. The inclusion of a colorant is largely for aesthetic purposes and the skilled artisan will be able to determine when the inclusion of this optional element is desirable and/or advantageous. For compositions intended to be used in PV modules, the inclusion of a colorant is considered desirable at least because many potential purchasers of PV modules still evaluate the modules for aesthetic properties. The inclusion of a colorant that confers a desirable color onto the composition, such as a color that matches one or more other components of the module, might render the module more aesthetically pleasing to the potential purchaser. The colorant could be also used as the filler (e.g. carbon black or titania) or it could be in the form of an organic pigment or dye.

The inventors have determined that, when included, the colorant is advantageously present in the composition in an amount from about 0.25 wt % to about 25 wt % of the total composition if the inorganic filler also acts as the colorant. This range provides the composition with desirable color properties without significantly affecting the other properties such as electrical conductivity (for carbon black) or the processability. If an organic dye or pigment is used, an amount less than about 1 wt % is believed to be appropriate and/or advantageous.

Any suitable colorant can be used in the claimed compositions, and the specific colorant selected for a particular composition will depend on various considerations, including the desired color of the composition. The inventors have determined that conventional colorants are suitable for use in the claimed compositions, including titanium dioxide, oxidized black (carbon black), and combinations thereof.

An antioxidant can also be included in the claimed compositions. The inclusion of an antioxidant is currently considered beneficial at least because it improves the resistance to photooxidative degradation of the composition. For compositions intended to be used in PV modules, the inclusion of an antioxidant is considered desirable at least because of the long term use in the presence of sunlight.

Any suitable antioxidant can be used in the claimed compositions, and the specific antioxidant selected for a particular composition will depend on various considerations, including color, cost, side reactions, longevity, effectiveness, and solubility in the encapsulant. The inventors have determined that radical scavengers are particularly well-suited for use as an antioxidant in compositions according to the invention at least because of their potential to scavenge radicals, such as those produced by a peroxide curing agent. Regenerative radical scavengers are considered particularly advantageous at least because of their ability to regenerate scavenging ability. It is noted, however, that nonregenerative antioxidants may also be used. This includes compounds with functional groups such as amines and phenols, or reducing agents such as phosphites, or any other suitable material that serves to decompose peroxides or to prevent radicals from propagating.

The inventors have determined that hindered-amine light stabilizers (HALS) are particularly well-suited for use in the claimed compositions. Examples of HALS suitable for use in the claimed compositions include [bis(2,2,6,6-tetramethyl-4-piperidinyl)sebacate], a pharmacologically active agent used worldwide as a light stabilizer for plastic materials and commercially available from Ciba-Geigy under the trade designation TINUVIN 770; and CHEMISORB 944 {Poly[[6-[(1, 1,3,3-tetramethylbutyl)amino]-s-triazine-2,4-diyl]-[(2,2,6, 6-tetramethyl-4-piperidyl)imino]-hexamethylene-[(2,2,6,6-tetramethyl-4-piperidyl)imino]]}, also commercially available from Ciba-Geigy.

The inventors have determined that, when included, the antioxidant is advantageously present in the composition in an amount up to 3 wt % of the total composition. This range provides the composition with good UV stability without significantly affecting the color, cost, and/or processability of the composition. A range of between about 0.7 wt % and about 1.5 wt % is considered particularly advantageous.

A UV absorbing material can also be included in the claimed compositions. The inclusion of a UV absorber is considered advantageous due to their ability to prevent or reduce UV induced degradation. Those skilled in the art will be able to determine when the inclusion of this optional element is desirable and/or advantageous. For compositions intended to be used in PV modules, the inclusion of a UV absorber is considered desirable at least because it may reduce or prevent UV induced degradation for the lifetime of the module.

The inventors have determined that, when included, the UV absorber is advantageously present in the composition in an amount up to about 2 wt % of the total composition. This range provides the composition with UV protection while still maintaining reasonable cost and color characteristics.

Any suitable UV absorber can be used in the claimed compositions, and the specific UV absorber selected for a particular composition will depend on various considerations, including color, cost, side reactions, longevity, effectiveness, and solubility in the encapsulant. The inventors have determined that benzotriazole-, benzophenone-, and hydroxylphenyltrazine-based UV absorbers are particularly well-suited for use in the claimed compositions. Examples of UV absorbers suitable for use in the claimed compositions include; Tinuvin 234 [2-(2H-benzotriazol-2-yl)4,6-bis(1-ethyl-1-phenylethylphenol], Tinuvin 1577 [2-(4,6-Diphenyl-1,3,5-triazin-2-yl-)-5-((hexyl)oxyl-phenol], and cyasorb UV-531 [2-hydroxy-4-n-octoxybenzophenone].

A desiccant can also be included in the claimed compositions. The inclusion of a desiccant is largely to prevent or reduce moisture from penetration into the module and the skilled artisan will be able to determine when the inclusion of the optional element is desirable and/or advantageous. For compositions intended to be used in PV modules, the inclusion of a desiccant is considered desirable at least because it may reduce or prevent moisture penetration for the lifetime of the module.

The inventors have determined that, when included, the desiccant is advantageously present in the composition in an amount up to 50 wt % of the total composition. This range provides the composition with the most moisture protection while still maintaining reasonable adhesion and processability.

Any suitable desiccant can be used in the claimed compositions, and the specific desiccant selected for a particular composition will depend on various considerations, including compatibility with the rubber, expansion upon adsorption or reaction with water, and side reactions. The inventors have determined that conventional desiccants are suitable for use in the claimed compositions, including molecular sieves, $CaSO_4$, CaO, MgO, silica gel, highly absorbent polymers (e.g. polyacrylic acid based copolymers) and combinations thereof.

The inventors have determined that the claimed encapsulant materials are particularly well-suited for use in PV modules that convert light energy into electrical energy. PV modules benefit from the inclusion of an encapsulant material that isolates the photovoltaic cell circuitry, such as silicon- and thin-film based 'solar cells,' from the surrounding environment at least because the ingress of moisture into the area occupied by the circuitry can enhance corrosion that negatively affects the performance and useable lifetime of the circuitry. Furthermore, as discussed above, existing encapsulant materials used in the manufacture of PV modules suffer from several drawbacks, including the production of undesirable by-products and relatively high water diffusivity rates.

The claimed encapsulant materials can be used in any PV module in which the inclusion of an encapsulant material, for isolation of the photovoltaic cell circuitry or for other purposes, is desirable, including known silicon- and thin film-based PV modules and future-developed technologies. The embodiments illustrated in the Figures are exemplary in nature and are not intended to provide an exhaustive list of configurations for PV modules that include the claimed encapsulant materials. Those skilled in the art will be able to determine suitable configurations for PV modules that include the claimed encapsulant materials based on various considerations, including the nature of the photovoltaic cell circuitry and the type and number of other components included in a particular PV module.

The claimed encapsulant materials may also be formed into a composite laminate structure with different formulations arranged in layers. This may be done to provide different colors on different sides or the composite laminate may be designed to provide good adhesion to different surfaces. Different colored sides may be more aesthetically pleasing and/or may serve to improve performance by reflecting or absorbing light. For example, one may want the side in contact with the PV device to be formulated for good adhesion to the cells and to match the color for aesthetic reason, and the other side may be white to reflect light to help keep the module cooler.

FIG. 1 illustrates a PV module 100 according to a first exemplary embodiment. The PV module 100 includes a glass sheet 110 and photovoltaic cell circuitry 112 disposed directly on the underside 111 of the glass sheet. An encapsulant material 114 according to an embodiment of the invention is disposed directly on the photovoltaic cell circuitry 112 and isolates the circuitry 112 from the surrounding environment. Optional sealing members 116, such as an edge tape and the like, and a second glass sheet 118 can also be included in the PV module 100. Those skilled in the art will understand the basic functioning of PV modules, including the illustrated and the claimed modules. The details of PV module function will, therefore, only be described briefly herein.

The glass sheet 110 can comprise any suitable section of glass. Those skilled in the PV module art will be able to determine a suitable glass type, size, and configuration for use in the module. Conventional materials, such as tempered glass, having conventional configurations and dimensions are considered suitable and, indeed, advantageous.

The photovoltaic cell circuitry 112 can comprise any suitable photovoltaic cell circuitry known in the art or hereinafter developed. Examples of suitable photovoltaic cell circuitry 112 for use in the claimed PV modules include amorphous silicon, Cadmium-Telluride (CdTe), and Copper-Indium-Galium-Selenium based thin film-based solar cells. The configuration illustrated in FIG. 1 is considered advantageous for use in PV modules that include CdTe-based photovoltaic cell circuitry at least because the CdTe is deposited directly on the underside 111 of the glass plate 110, thereby eliminating the necessity of transparency of the encapsulant material 114 as a consideration because the encapsulant material 114 is not positioned between the photovoltaic cell circuitry 112 and the solar energy, represented by arrows 125, presented to the exposure surface 150 of the PV module 100.

The photovoltaic cell circuitry 112 is in electrical communication with an output line (not illustrated) that carries the generated electrical energy to a downstream component, such as an inverter before being connected to a functional device with a demand for electrical energy. The photovoltaic cell circuitry can comprise a single 'solar cell' or two or more cells electrically connected to each other in a string as is known in the art.

The encapsulant material 114 can comprise any encapsulant material within the scope of the invention disclosed herein. Those skilled in the PV module art will be able to determine a particular encapsulant material according to the invention that is best suited for use in a particular PV module based on various considerations, including the nature of the photovoltaic cell circuitry, the presence or absence of optional components in the module, and the processability of the encapsulant material.

Figure 2:
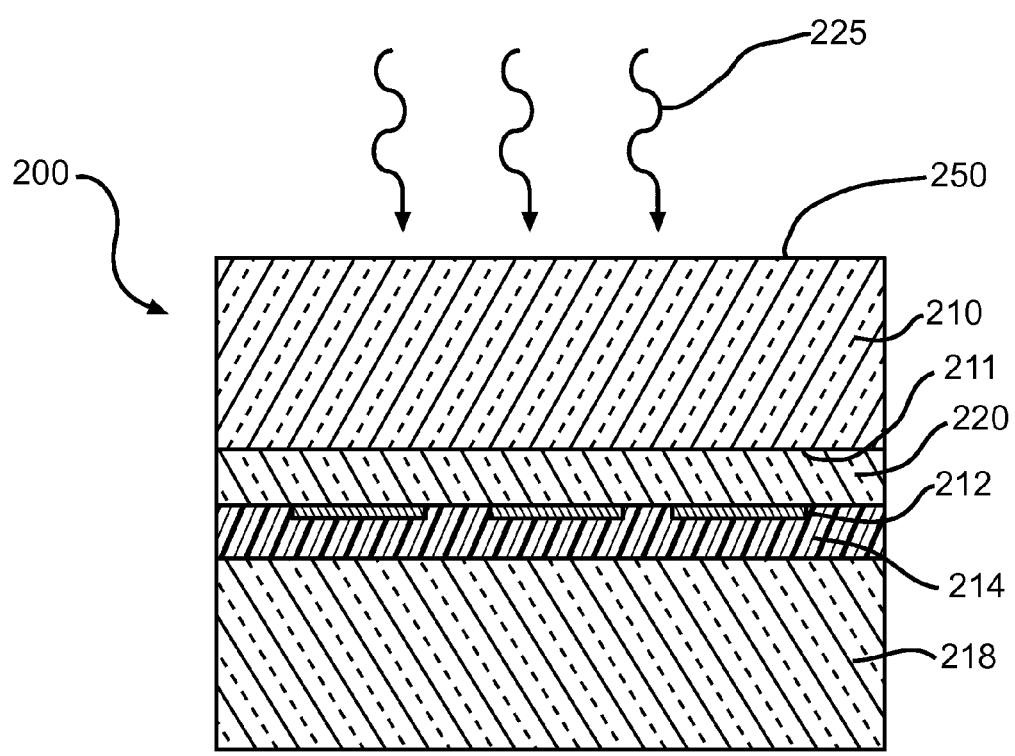
FIG. 2 is a sectional view of a solar module according to a second exemplary embodiment.

FIG. 2 illustrates a PV module 200 according to a second exemplary embodiment. The PV module 200 according to this embodiment includes a glass sheet 210 and photovoltaic cell circuitry 212 disposed beneath the underside 211 of the glass sheet. An encapsulant material 214 according to an embodiment of the invention is disposed directly on the photovoltaic cell circuitry 212 and isolates the circuitry 212 from the surrounding environment. A second encapsulant material 220, not necessarily according to an embodiment of the invention, is disposed between the underside 211 of the glass sheet 210 and the photovoltaic cell circuitry 212. An optional second glass sheet 218 can also be included in the PV module 200.

The embodiment illustrated in FIG. 2 is considered advantageous for use in PV modules that include silicon-based photovoltaic cell circuitry or thin film PV deposited on a metal foil or a polymeric material at least because it can eliminate the need for additional layers to provide color and/or electrical insulation. In silicon wafer-based photovoltaic cell circuitry, the silicon component is typically spaced from the underside 211 of the glass plate 210 using a transparent encapsulant to provide optical coupling. Use of such a second encapsulant material 220, between the underside 211 of the glass plate 210 and the photovoltaic cell circuitry 212, ensures that the solar energy, represented by arrows 225, presented to the exposure surface 250 of the PV module 200 is not reduced significantly prior to utilization in the photovoltaic cell circuitry 212.

Any suitable encapsulant material can be used as the second encapsulant material 220. A skilled artisan will be able to select an appropriate encapsulant material for use as the second encapsulant material 220 based on various considerations, including the desired transparency of the second encapsulant material, the ability to reduce corrosion, and the ability to provide mechanical integrity. The inventors have determined that conventional encapsulant materials known and used in the PV module art, including EVA, are suitable for use in the claimed modules as the second encapsulant material 220.

EXAMPLES

Example 1

Exemplary Formulations

Table I provides detailed formulation information for several example compositions according to the invention.

Example 2

Adhesion Properties

The encapsulant used in a PV application serves several purposes such as reducing corrosion and mechanically holding everything together. Good adhesion correlates with corrosion resistance and is also necessary for mechanical integrity. FIG. 3 indicates that these EPDM based materials can have excellent adhesive properties under severely stressful conditions.

Example 3

Moisture Penetration Analysis

Because water is known to accelerate corrosion, the ability of a back-sheet material to keep moisture out is related to its ability to protect a PV device. When used as a permeable back-sheet material, the claimed compositions has moisture permeation properties similar to composite laminate films comprising EVA/polyetheneterepthalate/Tedalar commonly used in the PV industry. However, if impermeable front- and back-sheets are used limiting moisture ingress to the sides, the lower permeation rates of these materials will dramatically outperform EVA.

In FIG. 4, the breakthrough time is defined as the time necessary for a film experiencing a step change in water concentration on one side to achieve 10% of the change toward the new equilibrium water vapor transmission rate. This breakthrough time is related to the square of the characteristic distance. For large PV modules with impermeable front- and back-sheets this corresponds to the distance to which moisture will penetrate in a specific time. FIG. 4 estimates the penetration depth for different materials as a function of temperature for a variety of potential PV encapsulants. A typical time averaged (day and night) module temperature will be between 15° C. and 35° C. (depending on mounting conditions and the local environment). In FIG. 4, this corresponds to 1/K between 0.00347 $K^{-1}$ and 0.00324 $K^{-1}$ and penetration depths of 3 to 10 cm after 20 years of field exposure. For comparison, moisture would penetrate distances greater than 1 m if EVA was used as the encapsulant. If moisture penetration can be significantly reduced, better PV performance and longevity should be achieved.

FIG. 5 shows the evolution of the moisture content of a PV module laminated using an impermeable back-sheet with constant external environmental conditions (see M. D. Kempe, Modeling of Rates of Moisture Ingress Into Photovoltaic Modules, *Solar Energy Materials & Solar Cells*, 90, 2720-2738 (2006)). Here BRP, a composition according to the invention, is modeled using effective solubility and diffusivity parameters and the module is assumed to be infinitely long and 40 cm wide. It can be seen that after 3 years, moisture can penetrate the center of this module if constructed using EVA, but when a composition according to the invention material is used, moisture only penetrates to a depth of about 6 cm after 24 years.

Example 4

Corrosion Analysis

To evaluate the ability of encapsulant materials to reduce corrosion, 800 Å aluminum films were deposited on glass (using magnetron sputtering) and laminated to another piece of glass using a variety of encapsulant materials as adhesives. The glass plates were laminated using an encapsulant material around the perimeter and in the center with an air gap in between. This allowed for comparison of the effects of humidity on bare aluminum to an encapsulated film. Samples were exposed to 1000 h of 85° C. and 85% RH.

FIGS. 6A and 6B show front-lit and back-lit photographs of a sample constructed using Composition 21, a composition according to the invention (formulation details for this and other exemplary compositions are listed in Table I). One can see that there are essentially no signs of corrosion. FIG. 6C shows a sample constructed using Dow Corning 700, an acetic acid condensation cure elastomer. Here, after exposure to humidity, the aluminum mirror is completely corroded where it is not contacted by the encapsulant. The dramatic difference in these results is presumably attributable to significantly lower moisture ingress rates that kept the water concentration very low in the air space of the Composition 21 sample.

FIG. 6D shows a sample constructed using EVA as the encapsulant. Here the greatest amount of corrosion is found where EVA is in direct contact with the aluminum film highlighting the corrosive nature of EVA. These results demonstrate the excellent corrosion protection capacity of these EPDM based films.

Example 5

Voltage Leakage Analysis

A test representative of the IEC 61215 Wet Leakage Current Test (section 10.15) was conducted on several example compositions. According to IEC 61215, after 1000 hours (h) of exposure to 85° C./85% RH modules must be immersed in a surfactant containing bath with an applied voltage of 500V. The measured resistance from the cell to the bath must be greater than 40 MΩ·m$^2$ for modules >0.1 m$^2$. To simulate this test, 5" square steel plates were laminated to glass using commercially available PV EVA between the glass and the steel plate with different back-sheets. For this construction, the resistance must be greater than 2.4 GΩ to pass. The steel sheets used were either 0.85 mm or 0.64 mm, Glass is 2.26 mm, and the EVA had a nominal 0.46 mm thickness per sheet. "Failed" indicates the ohm meter could not reach 500V because of high current. >10 GΩ indicates the current was too low to measure.

TABLE II

Results of voltage leakage analysis

| Backsheet Construction | Backsheet Thickness | Time (hr) | Resistance | Time (hr) | Resistance | Time (hr) | Resistance |
|---|---|---|---|---|---|---|---|
| EVA | 0.5 mm | 0 | 1 MΩ | 504 | Failed | 1032 | Failed |
| EVA/TPE | 0.69 mm | 0 | 6.6 GΩ | 504 | 8.5 GΩ | 1032 | 9.1 GΩ |
| Composition 17 | 0.43 mm | 0 | 8.6 GΩ | 528 | >10 GΩ | 1224 | >10 GΩ |
| Composition 64 | 0.30 mm | 0 | 9.6 GΩ | 528 | >10 GΩ | 1224 | >10 GΩ |

TABLE II-continued

Results of voltage leakage analysis

| Backsheet Construction | Backsheet Thickness | Time (hr) | Resistance | Time (hr) | Resistance | Time (hr) | Resistance |
|---|---|---|---|---|---|---|---|
| Composition 44/ Composition 22 | 0.78 mm | 0 | 9.97 GΩ | 456 | >10 GΩ | 1152 | >10 GΩ |
| Composition 44/PET/44 | 0.71 mm | 0 | 9.8 GΩ | 456 | >10 GΩ | 1152 | >10 GΩ |
| Composition 54 | 0.33 mm | 0 | 8.4 GΩ | 528 | 9.8 GΩ | 1824 | >10 GΩ |
| Composition 75 | 0.33 mm | 0 | 8.14 GΩ | 528 | 9.046 GΩ | 1824 | >10 GΩ |
| Composition 9 | 0.33 mm | 0 | 8.63 GΩ | 192 | 8.5 GΩ | 1488 | >10 GΩ |

Table II presents the results of the voltage leakage analysis. The "Time" indicates how long the sample was exposed to 85° C. and 85% RH. The sample construction labeled "EVA/TPE" represents a standard accepted construction with a composite back-sheet with layers of EVA/Polyethylene-Terepthalate/Tedlar. One can see from Table II that even at thickness less than half the "EVA/TPE" thickness, the exemplary compositions performed better than the EVA-based constructions. If an application required even better electrical insulation or if it had a greater tendency for metallic parts to protrude through the polymer, then another layer composed of a puncture resistant material or a better insulating material could be added. Alternatively, one could simply use a thicker film. Note that the compositions according to exemplary embodiments are referred to as 'Composition X'; the specific formulation information for the listed compositions is presented in Table I by referencing the composition number corresponding to the value for 'X'.

Example 6

Ultraviolet Stability

The yellowness index (YI) is a measure of the perceived color of an object by a human observer. Changes in YI serve as an indication of the degree of degradation of a material. Samples were exposed to 60° C. and 60% RH and 2.5 UV suns for varying amounts of time in an Atlas Ci4000 weatherometer. Table III presents results of this evaluation. The Glass/EVA/TPE sample construction represents a common system use with PV. Under these conditions samples are receiving a UVB dose accelerated by a factor of about 220 times and a UVA-II dose accelerated by a factor of about 57 times relative to outdoor exposure. It was found that the Polyethylene-Terepthalate layer in these laminate films begins to degrade very rapidly and delaminated from the Tedlar film after 4300 hours (h). In contrast, Composition 74, a composition according to the invention (formulation details for this and other exemplary compositions are listed in Table I), maintained a low YI of 0.22 after 9024 h exposure. Composition 16, another exemplary composition according to the invention, had reduced amounts of titania compared to Composition 74 and had a slightly higher YI of 2.8 after 6207 h. Composition 65, another exemplary composition according to the invention, was similar to Composition 74 but it did not have any HALS in its formulation. Being protected from the UV radiation by the EVA layer, it only degraded moderately in color, but was observed to crack and shrink around the edges where the EVA layer was much thinner. This demonstrates the need for HALS in the formulations. Exemplary Compositions 6 and 38 were tested directly behind the glass (no UV blocking EVA layer) with a glass back-sheet to reduce oxygen ingress. These samples did experience some yellowing predominantly in the center presumably where oxygen could not penetrate and photobleach the reaction by-products. This issue is probably not a problem because the degradation was still small and only cosmetic. Furthermore, only superstrate thin film devices would use this material without a transparent film in front, here a black sample would be preferable for aesthetic reasons.

TABLE III

Yellowness index after exposure to 60° C., 60% RH, and 2.5 suns.
Unless specified, the glass was low iron and non-ceriated to allow transmission of most of the UV portion of the spectrum. All exemplary compositions included titania filler to produce a white, highly reflecting material. Note that the compositions according to exemplary embodiments are referred to as 'Composition X'; the specific formulation information for the listed compositions is presented in Table I by referencing the composition number corresponding to the value for 'X'.

| Sample | 0 h | 65 h | 682 h | 4173 h | 5137 h | 6207 h | 9024 h |
|---|---|---|---|---|---|---|---|
| Glass/EVA/TPE | Front 0.34 Back 0.27 | 26.7 | 30.6 | | Front 71.0 Back 4.31 Delaminated | | |
| Glass/EVA/Composition 74 | | | | | | | Fron 0.22 Back 0.19 |
| Glass/EVA/Composition 16 | | | | | | Front 2.8 Back 1.4 | |
| Ce Glass/EVA/Composition 1 | Front 2.0 Back 1.1 | | | | | | |

TABLE III-continued

Yellowness index after exposure to 60° C., 60% RH, and 2.5 suns.
Unless specified, the glass was low iron and non-ceriated to allow transmission of most of the UV portion of the spectrum. All exemplary compositions included titania filler to produce a white, highly reflecting material. Note that the compositions according to exemplary embodiments are referred to as 'Composition X'; the specific formulation information for the listed compositions is presented in Table I by referencing the composition number corresponding to the value for 'X'.

| Sample | Time | | | | | | |
|---|---|---|---|---|---|---|---|
| | 0 h | 65 h | 682 h | 4173 h | 5137 h | 6207 h | 9024 h |
| Glass/EVA/Composition 65 | Front 1.32<br>Back −0.47 | 0.89 | 2.37 | | Front 3.0<br>Back 1.72 | | |
| Glass/Composition 6/Glass | | | | Front 11.4<br>Back 0.25 | | | |
| Glass/Composition 38/Glass | | | | Front 13.7<br>Back 0.78 | | | |

Example 7

Mechanical Modulii and Phase Transitions

The mechanical characteristics of an encapsulant material are important to ensure PV materials are protected form mechanical and thermal stresses. Typically, modules are tested and designed to operate at temperatures between 85° C. and −40° C. In FIG. 7, EVA is shown to go through both a melting transition (~55° C.) and a glass transition (~−25° C.) in the range of temperatures a PV module might be exposed to. This makes design of a module to withstand mechanical stress more difficult. Similarly, PVB suffers from the presence of a glass transition (~40° C.) making the material less able to absorb the mechanical energy and protect the cells. The other materials (PDMS, TPU and BRP-C) have good mechanical properties over a wide range of temperatures. With these materials, testing conducted at room temperature is applicable for a wide range of use conditions.

In FIG. 7, the EPDM resin was selected to have 7.5±1 wt % diene monomer resulting in a copolymer without a melting transition. In some applications, a lower diene content may be needed if for example a significant reduction in tack was necessary to handle the material.

The foregoing detailed description provides exemplary embodiments of the invention and includes the best mode for practicing the invention. The description and illustration of embodiments is intended only to provide examples of the invention and not to limit the scope of the invention, or its protection, in any manner.

TABLE I

Example Compositions

| Ingredient | Number Comment | 1 Percent | 2 Percent | 3 Percent | 4 Percent | 5 Percent | 6 Percent | 7 Percent | 8 Percent | 9 Percent | 10 Percent | 11 Percent |
|---|---|---|---|---|---|---|---|---|---|---|---|---|
| KEP281F | Very high MW EPDM. Mn = 85,000, Mw = 230,000, Mz = 62,000, PDI = 2.7 | | 56.12 | | 62.32 | | | | | | | |
| EP 33 | Higher molecular weight polymer for reduced tack. 8 to 9% unsaturation. Mn = 41,000, Mw-166,000, Mz = 630,000, Mw/Mn = 4.0 | 63.40 | | 63.40 | | 75.91 | 71.54 | 93.06 | 36.80 | 73.03 | 63.13 | 53.53 |
| (filler) Hisile | Silica | 8.65 | 7.65 | 8.65 | 8.50 | 2.40 | 2.26 | 2.94 | 10.04 | 2.31 | 1.99 | 7.30 |
| Aztech Tmch 40 | Peroxide. Similar to lupersol 231 [1,1-bis(t-butyl peroxy) 3,3,5-trimethyl cyclohexane]. Slightly more reactive than lupersol TBEC. | 0.58 | 0.51 | 0.58 | 0.57 | 0.80 | 0.75 | 0.98 | | 0.77 | 0.66 | |
| Tinuvin 234 | UV Absorber | | 0.26 | | 0.57 | | | 0.98 | | 0.77 | | |
| Tinuvin 770 | HALS | 0.58 | 0.51 | 0.58 | 0.57 | 0.40 | | 0.98 | 0.33 | 0.77 | 0.66 | 0.49 |
| Chimasorb 944 | HALS/Antioxidant | 0.58 | 0.51 | 0.58 | 0.57 | | 0.75 | 0.98 | | 0.77 | 0.66 | 0.49 |
| Silane 172 | Silane Coupling agent, vinyl tri(2methoxy-ethoxy)silane | 0.29 | 0.26 | 0.29 | 0.28 | 0.07 | 0.07 | 0.09 | 0.17 | 0.07 | 0.33 | 0.24 |
| TiO2 | | 2.88 | | 2.88 | | | 3.01 | | | | 2.66 | 1.95 |
| (Zinc Diacrylate) SR 705 | No additives like with the Sartomer | 17.29 | 15.31 | 17.29 | 17.00 | 19.98 | 18.83 | | | 19.22 | 16.61 | 12.17 |
| (Amine) Octamin Flake (250) oxidised Black | Octylated Diphenyl Amine 4,4'-dioctyldiphenylamine | | | | | | | | | 0.77 | | |
| ZnO | | | 2.55 | | 2.83 | 0.04 | | | | 1.54 | | |
| Steric Acid | Processing aid | | | | | | | | 1.34 | | | |
| Tinuvin 328 | | | | | | | | | 0.33 | | | |
| Chimasorb 119 | HALS | | | | | | | | | | | |
| Antioxidant 58 | Zinc salt of 2 mercapto-4-5-methyl bnzimidazole. Heat Stabilizer. | | | | | | | | | | | |
| Trielene 67 | liquid EPDM 11% unsaturated, Mz = 7700 | 5.76 | 16.33 | | | 0.40 | 2.79 | | 16.06 | | 13.29 | 23.36 |
| Butene 1900 | oil | | | | | | | | 1.67 | | | |
| Sartomer 75 EP2A | anti scorch agent yellow. | | | | | | | | 12.38 | | | |
| Vulcup 40 KE | 40% active | | | | | | | | 0.67 | | | |
| indopol H100 | Low Molecular Weight Butene | | | | 6.80 | | | | | | | |
| NC2403@ | liquid Metallic acrylate (propritary); acrylate easter(CASRN proprietary); alcohol(CASRN proprietary) | | | | | | | | | | | |
| hallbond @ RX-13977 | dimer ester, hexamethy melamine | | | 5.76 | | | | | | | | |
| poly fill (aluminum silicate) | talc | | | | | | | | 20.21 | | | |
| molecular sieve HP#11 | crushed zeolites | | | | | | | | | | | |
| paraffinic oil sun2280 minstron vapor(talc) | Aliphatic fatty acid | | | | | | | | | | | |
| Black HAF 330 | | | | | | | | | | | | |
| N650(Black) | | | | | | | | | | | | |
| Trilene77 | | | | | | | | | | | | |
| EP57F | | | | | | | | | | | | |

TABLE I-continued

Example Compositions

| Ingredient | Number Comment | 12 Percent | 13 Percent | 14 Percent | 15 Percent | 16 Percent | 17 Percent | 18 Percent | 19 Percent | 20 Percent | 21 Percent | 22 Percent |
|---|---|---|---|---|---|---|---|---|---|---|---|---|
| KEP281F | Very high MW EPDM, Mn = 85,000, Mw = 230,000, Mz = 62,000, PDI = 2.7 | | | | | | | | | | | |
| EP 33 | Higher molecular weight polymer for reduced tack. 8 to 9% unsaturation. Mn = 41,000, Mw-166,000, Mz = 630,000, Mw/Mn = 4.0 | 62.88 | 54.59 | 50.34 | 78.62 | 73.59 | 72.47 | 61.62 | 63.40 | 61.62 | 52.76 | 93.06 |
| (filler) Hsile | Silica | 1.99 | 7.44 | 6.86 | 7.37 | 2.32 | 2.29 | 8.40 | 8.65 | 8.40 | 7.19 | 2.94 |
| Aztech Tmch 40 | Peroxide. Similar to lupersol 231 [1,1-bis(t-butyl peroxy) 3,3,5-trimethyl cyclohexane]. Slightly more reactive than lupersol TBEC. | 0.66 | 0.50 | 0.46 | 0.49 | 0.77 | 0.76 | 0.56 | 0.58 | 0.56 | 0.48 | 0.98 |
| Tinuvin 234 | UV Absorber | | 1.99 | | | 0.77 | 0.76 | | | | | 0.98 |
| Tinuvin 770 | HALS | 0.66 | 0.50 | | 0.49 | 0.77 | 0.76 | 0.56 | 0.58 | 0.56 | | 0.98 |
| Chimasorb 944 | HALS/Antioxidant | 0.66 | 0.50 | 0.46 | 0.49 | 0.77 | | 0.56 | 0.58 | 0.56 | | 0.98 |
| Silane 172 | Silane Coupling agent, vinyl tri(2methoxy-ethoxy)silane | 0.06 | 0.25 | 0.23 | 0.25 | 0.07 | 0.07 | 0.28 | 0.29 | 0.28 | 0.24 | 0.09 |
| TiO2 | | | | | | 1.55 | 3.05 | | | 2.80 | | |
| (Zinc Diacrylate) SR 705 | No additives like with the Sartomer | 16.55 | 14.89 | | 12.29 | 19.37 | 19.07 | 14.01 | 17.29 | 16.81 | | |
| (Amine) Octamin Flake (250) oxidised Black | Octylated Diphenyl Amine 4,4'-dioctyldiphenylamine | | 2.48 | | | | | | 2.88 | | | |
| ZnO | | | | 2.29 | | | | | | | 1.92 | |
| Steric Acid | Processing aid | | | 1.83 | | | | | | | 0.48 | |
| Tinuvin 328 | | | | 0.46 | | | | | | | | |
| Chimasorb 119 | HALS | | | | | | | | | | | |
| Antioxidant 58 | Zinc salt of 2 mercapto-4-5-methyl bnzimidazole. Heat Stabilizer. | | | | | | 0.76 | | | | | |
| Trielene 67 | liquid EPDM 11% unsaturated. Mz = 7700 | 16.55 | 7.44 | 21.97 | | | | 14.01 | | | 23.02 | |
| Butene 1900 | oil | | | 2.29 | | | | | | | 2.40 | |
| Sartomer 75 EP2A | anti scorch agent yellow. | | | 12.36 | | | | | | | 10.55 | |
| Vulcup 40 KE | 40% active | | | 0.92 | | | | | | | 0.96 | |
| indopol H100 | Low Molecular Weight Butene | | 2.48 | | | | | | 5.76 | 8.40 | | |
| NC2403@ | liquid Metallic acrylate (proprietary); acrylate easter(CASRN proprietary); alcohol(CASRN proprietary) | | | | | | | | | | | |
| hallbond @ RX-13977 | dimer ester, hexamethy melamine | | 5.46 | | | | | | | | | |
| poly fill (aluminum silicate) | | | | | | | | | | | | |
| molecular sieve | talc | | | | | | | | | | | |
| HP#11 | crushed zeolites | | 1.49 | | | | | | | | | |
| paraffinic oil sun2280 | Aliphatic fatty acid | | | | | | | | | | | |
| minstron vapor(talc) | | | | | | | | | | | | |
| Black HAF 330 | | | | | | | | | | | | |
| N650(Black) | | | | | | | | | | | | |
| Trilene77 | | | | | | | | | | | | |
| EP57F | | | | | | | | | | | | |

TABLE I-continued

Example Compositions

| Ingredient | Number Comment | 23 Percent | 24 Percent | 25 Percent | 26 Percent | 27 Percent | 28 Percent | 29 Percent | 30 Percent | 31 Percent | 32 Percent | 33 Percent |
|---|---|---|---|---|---|---|---|---|---|---|---|---|
| KEP281F | Very high MW EPDM, Mn = 85,000, Mw = 230,000, Mz = 62,000, PDI = 2.7 | | | | 13.85 | 13.70 | 63.04 | 14.08 | | | | |
| EP 33 | Higher molecular weight polymer for reduced tack. 8 to 9% unsaturation. Mn = 41,000, Mw-166,000, Mz = 630,000, Mw/Mn = 4.0 | 73.56 | 6.82 | 63.40 | 27.70 | 27.40 | | 28.17 | 57.14 | 13.33 | 94.72 | 66.07 |
| (filler) Hisile | Silica | 2.32 | | 8.65 | 8.31 | 8.22 | 8.60 | 8.45 | 7.79 | | 2.99 | 9.01 |
| Aztech Tmch 40 | Peroxide. Similar to lupersol 231 [1,1-bis(t-butyl peroxy) 3,3,5-trimethyl cyclohexane]. Slightly more reactive than lupersol TBEC. | 0.77 | 0.23 | 0.58 | | 0.55 | 0.57 | 0.56 | 0.52 | | 0.71 | 0.60 |
| Tinuvin 234 | UV Absorber | | | | | | | | | | | |
| Tinuvin 770 | HALS | | | 0.58 | 0.55 | 0.55 | 0.57 | 0.56 | 0.52 | | | 0.60 |
| Chimasorb 944 | HALS/Antioxidant | | | 0.58 | 0.55 | 0.55 | 0.57 | 0.56 | 0.52 | | | 0.60 |
| Silane 172 | Silane Coupling agent, vinyl tri(2methoxy-ethoxy)silane | 0.19 | | 0.29 | 0.28 | 0.27 | 0.29 | 0.28 | 0.26 | | 0.09 | 0.30 |
| TiO2 | | 3.10 | | | | | | | | | | |
| (Zinc Diacrylate) SR 705 | | 19.36 | | 17.29 | 16.62 | 16.44 | 17.19 | 16.90 | 15.58 | | | 18.02 |
| (Amine) Octamin Flake (250) oxidised Black | No additives like with the Sartomer Octylated Diphenyl Amine 4,4'-dioctyldiphenylamine | | | 2.88 | 2.77 | 2.74 | 2.87 | 2.82 | 2.60 | | 0.30 | 3.00 |
| ZnO | | 0.56 | 1.14 | | | | | | | 1.96 | 0.72 | |
| Steric Acid | Processing aid | 0.14 | 0.23 | | | | | | | 0.39 | 0.18 | |
| Tinuvin 328 | | | | | | | | | | | 0.30 | |
| Chimasorb 119 | HALS | | | | | | | | | | | |
| Antioxidant 58 | Zinc salt of 2 mercapto-4-5-methyl bnzimidazole. Heat Stabilizer. | | | | | | | | | | | |
| Trielene 67 | liquid EPDM 11% unsaturated. Mz = 7700 oil | | | | | 26.30 | | 27.04 | | 2.35 | | |
| Butene 1900 | | | | | | | | | | | | |
| Sartomer 75 EP2A | anti scorch agent yellow. 40% active | | 2.27 | | | | | | | | | |
| Vulcup 40 KE | | | .68 | | | | | | | 1.18 | | |
| indopol H100 | Low Molecular Weight Butene liquid Metallic acrylate (propritary); acrylate easter(CASRN proprietary); alcohol(CASRN proprietary) | | | | | 2.74 | 2.87 | | 2.60 | | | |
| NC2403@ hallbond @ RX-13977 poly fill (aluminum silicate) | dimer ester, hexamethy melamine | | | 5.76 | | | 2.87 | | 2.60 | | | |
| molecular sieve | talc | | | | 1.66 | | | | | | | |
| HP#11 | crushed zeolites | | | | | | | | 1.56 | 15.69 | | 1.80 |
| paraffinic oil sun2280 minstron vapor(talc) | Aliphatic fatty acid | | 13.64 | | | | | | | 27.45 | | |
| Black HAF 330 | | | 45.45 | | | | | | | | | |
| N650(Black) | | | 4.55 | | | | | | | 11.76 | | |
| Trilene77 | | | | | | | | | | 25.88 | | |
| EP57F | | | 25.00 | | | | | | | | | |

TABLE I-continued

Example Compositions

| Ingredient | Number Comment | 34 Percent | 35 Percent | 36 Percent | 37 Percent | 38 Percent | 39 Percent | 40 Percent | 41 Percent | 42 Percent | 43 Percent | 44 Percent |
|---|---|---|---|---|---|---|---|---|---|---|---|---|
| KEP281F | Very high MW EPDM, Mn = 85,000, Mw = 230,000, Mz = 62,000, PDI = 2.7 | 24.69 | | 65.48 | 13.77 | | | | | | | |
| EP 33 | Higher molecular weight polymer for reduced tack. 8 to 9% unsaturation. Mn = 41,000, Mw-166,000, Mz = 630,000, Mw/Mn = 4.0 | 24.69 | 62.32 | | 27.55 | 71.01 | 55.14 | 72.47 | 59.95 | 71.98 | 73.59 | 72.91 |
| (filler) Hisile | Silica | 7.41 | 8.50 | 8.93 | 8.26 | 2.24 | 7.52 | 2.29 | 8.17 | 2.27 | 2.32 | 1.99 |
| Aztech Tmch 40 | Peroxide. Similar to lupersol 231 [1,1-bis(t-butyl peroxy) 3,3,5-trimethyl cyclohexane]. Slightly more reactive than lupersol TBEC. | 0.49 | | | 0.55 | | | | | | | |
| Tinuvin 234 | UV Absorber | 0.49 | 0.57 | 0.60 | 0.55 | 0.75 | 0.50 | 0.76 | 0.54 | 0.76 | 0.77 | 0.66 |
| Tinuvin 770 | HALS | 0.49 | 0.57 | 0.60 | 0.55 | 0.75 | | 0.38 | 0.54 | 0.38 | 0.39 | |
| Chimasorb 944 | HALS/Antioxidant | 0.49 | 0.57 | 0.60 | 0.55 | 0.75 | | 0.38 | 0.54 | 0.38 | 0.39 | |
| Silane 172 | Silane Coupling agent, vinyl tri(2methoxy-ethoxy)silane | 0.25 | 0.28 | 2.98 | 0.28 | 0.07 | 0.25 | 0.07 | 0.27 | 0.07 | 0.07 | 0.06 |
| TiO2 | | | | | | 2.99 | | | | | | |
| (Zinc Diacrylate) SR 705 | No additives like with the Sartomer | 14.81 | 17.00 | 17.86 | 16.53 | 18.69 | 12.53 | 19.07 | 16.35 | 18.94 | 19.37 | 16.57 |
| (Amine) Octamin Flake | Octylated Diphenyl Amine 4,4'-dioctyldiphenylamine | | | | | | | | | | | 0.53 |
| (250) oxidised Black | | 2.47 | 2.83 | 2.98 | 2.75 | | | 4.58 | 2.72 | 4.55 | 3.10 | 6.63 |
| ZnO | | | | | | | | | | 0.55 | | 0.48 |
| Steric Acid | | | | | | | | | | 0.14 | | 0.12 |
| Tinuvin 328 | | | | | | | | | | | | 0.06 |
| Chimasorb 119 | HALS | | | | | | | | | | | |
| Antioxidant 58 | Zinc salt of 2 mercapto-4-5-methyl benzimidazole. Heat Stabilizer. | | | | | | | | | | | |
| Trielene 67 | liquid EPDM 11% unsaturated. Mz = 7700 | 23.70 | | | 26.45 | 2.77 | 24.06 | | | | | |
| Butene 1900 | oil | | | | | | | | | | | |
| Sartomer 75 EP2A | anti scorch agent yellow. | | | | | | | | | | | |
| Vulcup 40 KE | 40% active | | | | 1.38 | | | | 2.72 | | | |
| indopol H100 | Low Molecular Weight Butene | | 2.83 | | | | | | | | | |
| NC2403@ | liquid Metallic acrylate (proprietary); acrylate easter(CASRN proprietary); alcohol(CASRN proprietary) | | 2.83 | | | | | | 5.99 | | | |
| hallbond @ RX-13977 poly fill (aluminum silicate) | dimer ester, hexamethy melamine | | | | | | | | | | | |
| molecular sieve | crushed zeolites | | | | | | | | | | | |
| HP#11 | | | | | | | | | | | | |
| paraffinic oil sun2280 | | | 1.70 | | 0.83 | | | | 1.63 | | | |
| minstron vapor(talc) | talc | | | | | | | | | | | |
| Black HAF 330 | | | | | | | | | | | | |
| N650(Black) | | | | | | | | | | | | |
| Trilene77 | | | | | | | | | | | | |
| EP57F | Aliphatic fatty acid | | | | | | | | | | | |

TABLE I-continued

Example Compositions

| Ingredient | Number Comment | 45 Percent | 46 Percent | 47 Percent | 48 Percent | 49 Percent | 50 Percent | 51 Percent | 52 Percent | 53 Percent | 54 Percent | 55 Percent |
|---|---|---|---|---|---|---|---|---|---|---|---|---|
| KEP281F | Very high MW EPDM, Mn = 85,000, Mw = 230,000, Mz = 62,000, PDI = 2.7 | | 13.85 | 48.57 | | | | | | | | |
| EP 33 | Higher molecular weight polymer for reduced tack. 8 to 9% unsaturation. Mn = 41,000, Mw-166,000, Mz = 630,000, Mw/Mn = 4.0 | 74.02 | 27.70 | | 59.30 | 55.42 | 67.33 | 60.94 | 78.20 | 73.03 | 63.30 | 61.62 |
| (filler) Hisile | Silica | 2.34 | 8.31 | 6.62 | 8.09 | 7.56 | 2.13 | 8.31 | | 2.31 | 2.00 | 8.40 |
| Aztech Tmch 40 | Peroxide. Similar to lupersol 231 [1,1-bis(t-butyl peroxy) 3,3,5-trimethyl cyclohexane]. Slightly more reactive than lupersol TBEC. | 0.78 | 0.55 | 0.44 | 0.54 | 0.50 | 0.71 | 0.55 | 0.82 | 0.77 | 0.67 | 0.56 |
| Tinuvin 234 | UV Absorber | 0.78 | 0.55 | 0.44 | 0.54 | 0.50 | | 0.55 | | | 0.67 | |
| Tinuvin 770 | HALS | 0.78 | 0.55 | 0.44 | 0.54 | 0.50 | 0.71 | 0.55 | | | 0.67 | 0.56 |
| Chimasorb 944 | HALS/Antioxidant | 0.78 | 0.55 | 0.44 | 0.54 | 0.50 | 0.71 | 0.28 | | | 0.06 | 0.56 |
| Silane 172 | Silane Coupling agent, vinyl tri(2methoxy-ethoxy)silane | 0.07 | 0.28 | 0.22 | 0.27 | 0.25 | 0.06 | | 0.07 | 0.07 | 2.67 | 0.28 |
| TiO2 | | | | | | | | | | | | |
| (Zinc Diacrylate) SR 705 | No additives like with the Sartomer | 19.48 | 16.62 | 13.25 | 16.17 | 15.11 | 17.72 | 13.85 | 16.46 | 19.22 | 16.66 | 16.81 |
| (Amine) Octamin Flake | Octylated Diphenyl Amine 4,4'-dioctyldiphenylamine | 0.78 | 2.77 | 2.21 | 2.70 | 2.52 | | 1.11 | | 4.61 | | 2.80 |
| (250) oxidised Black | | 0.19 | | | | | | | | | | |
| ZnO | | | | | | | | | 0.59 | | | |
| Steric Acid | Processing aid | | | | | | | | 0.15 | | | |
| Tinuvin 328 | | | | | | | | | | | | |
| Chimasorb 119 | HALS | | | | | | | | | | | |
| Antioxidant 58 | Zinc salt of 2 mercapto-4-5-methyl benzimidazole. Heat Stabilizer. | | | | | | | | | | | |
| Trielene 67 | liquid EPDM 11% unsaturated. Mz = 7700 | | 26.59 | 14.13 | | 7.56 | 10.63 | 13.85 | | | 13.33 | 8.40 |
| Butene 1900 | oil | | | | | | | | | | | |
| Sartomer 75 EP2A | anti scorch agent yellow. | | | | | 2.52 | | | | | | |
| Vulcup 40 KE | 40% active | | | | | | | | | | | |
| indopol H100 | Low Molecular Weight Butene | | | | 2.70 | | | | | | | |
| NC2403@ | liquid Metallic acrylate (proprietary); acrylate easter(CASRN proprietary); alcohol(CASRN proprietary) | | | | | 5.54 | | | | | | |
| hallbond @ RX-13977 poly fill (aluminum silicate) | dimer ester, hexamethy melamine | | | | | | | | | | | |
| molecular sieve | talc | | | | | | | | 3.70 | | | |
| HP#11 | crushed zeolites | | | | | 1.51 | | | | | | |
| paraffinic oil sun2280 minstron vaport(talc) | Aliphatic fatty acid | | 1.66 | | | | | | | | | |
| Black HAF 330 N650(Black) | | | | | | | | | | | | |
| Trilene77 | | | | 13.25 | | | | | | | | |
| EP57F | | | | | 8.63 | | | | | | | |

TABLE I-continued

Example Compositions

| Ingredient | Number Comment | 56 Percent | 57 Percent | 58 Percent | 59 Percent | 60 Percent | 61 Percent | 62 Percent | 63 Percent | 64 Percent | 65 Percent | 66 Percent |
|---|---|---|---|---|---|---|---|---|---|---|---|---|
| KEP281F | Very high MW EPDM, Mn = 85,000, Mw = 230,000, Mz = 62,000, PDI = 2.7 | | | | | | | | 52.01 | | | |
| EP 33 | Higher molecular weight polymer for reduced tack. 8 to 9% unsaturation. Mn = 41,000, Mw-166,000, Mz = 630,000, Mw/Mn = 4.0 | 63.40 | 71.66 | 60.55 | 54.86 | 71.92 | 64.52 | 73.31 | | 74.60 | 71.20 | 54.05 |
| (filler) Hisile | Silica | 8.65 | 9.77 | 0.05 | 7.48 | 2.27 | 8.80 | 2.31 | 7.09 | 2.36 | 9.71 | 7.37 |
| Aztech Tmch 40 | Peroxide. Similar to lupersol 231 [1,1-bis(t-butyl peroxy) 3,3,5-trimethyl cyclohexane]. Slightly more reactive than lupersol TBEC. | 0.58 | 0.65 | 0.68 | 1.00 | 0.76 | 0.59 | 0.77 | 0.47 | 0.79 | | 0.49 |
| Tinuvin 234 | UV Absorber | | | | | 0.76 | | 0.39 | | 0.79 | | |
| Tinuvin 770 | HALS | 0.58 | 0.65 | | | 0.76 | 0.59 | 0.39 | 0.47 | 0.79 | 0.65 | 0.49 |
| Chimasorb 944 | HALS/Antioxidant | 0.58 | 0.65 | 0.05 | 0.25 | 0.76 | 0.59 | | 0.47 | | 0.65 | 0.49 |
| Silane 172 | Silane Coupling agent, vinyl tri(2methoxy-ethoxy)silane | 0.29 | 0.33 | | | 0.07 | 0.29 | 0.07 | 0.24 | 0.07 | 0.32 | 0.25 |
| TiO2 | | 2.88 | | | | 3.03 | | 3.09 | 2.36 | | | |
| (Zinc Diacrylate) SR 705 | No additives like with the Sartomer | 17.29 | | 13.19 | 12.47 | 18.93 | 17.60 | 19.29 | 14.18 | 19.63 | 16.18 | 12.29 |
| (Amine) Octamin Flake (250) oxidised Black | Octylated Diphenyl Amine 4,4′-dioctyldiphenylamine | | | | | 0.76 | 1.17 | | | 0.20 | | 0.98 |
| ZnO | | | | 0.38 | | | | | | | | |
| Steric Acid | Processing aid | | | 0.09 | | | | | | | | |
| Tinuvin 328 | | | | | | | | | | | | |
| Chimasorb 119 | HALS | | | | | | | | | | | |
| Antioxidant 58 | Zinc salt of 2 mercapto-4-5-methyl bnzimidazole. Heat Stabilizer. | | | | | | | 0.39 | | 0.79 | | |
| Trielene 67 | liquid EPDM 11% unsaturation. Mz = 7700 | | | | 23.94 | | | | 22.70 | | | 23.59 |
| Butene 1900 | oil | | | | | | | | | | | |
| Sartomer 75 EP2A | anti scorch agent yellow. 40% active | | 16.29 | | | | | | | | | |
| Vulcup 40 KE | Low Molecular Weight Butene | 2.88 | | | | | | | | | | |
| indopol H100 | liquid Metallic acrylate (proprietary): acrylate easter(CASRN proprietary): alcohol(CASRN proprietary) | 2.88 | | | | | | | | | 1.29 | |
| NC2403@ hallbond @ RX-13977 poly fill (aluminum silicate) | dimer ester, hexamethy melamine | | | | | | 5.87 | | | | | |
| molecular sieve | talc | | | 25.03 | | | | | | | | |
| HP#11 | crushed zeolites | | | | | | | | | | | |
| paraffinic oil sun2280 | Aliphatic fatty acid | | | | | | | | | | | |
| minstron vapor(talc) | | | | | | | | | | | | |
| Black HAF 330 | | | | | | | | | | | | |
| N650(Black) | | | | | | | | | | | | |
| Trilene77 | | | | | | | | | | | | |
| EP57F | | | | | | | | | | | | |

TABLE I-continued

Example Compositions

| Ingredient | Number Comment | 67 Percent | 68 Percent | 69 Percent | 70 Percent | 71 Percent | 72 Percent | 73 Percent | 74 Percent | 75 Percent | 76 Percent | 77 Percent |
|---|---|---|---|---|---|---|---|---|---|---|---|---|
| KEP281F | Very high MW EPDM, Mn = 85,000, Mw = 230,000, Mz = 62,000, PDI = 2.7 | | | | | | 51.89 | | | | | |
| EP 33 | Higher molecular weight polymer for reduced tack. 8 to 9% unsaturation. Mn = 41,000, Mw-166,000, Mz = 630,000, Mw/Mn = 4.0 | 64.52 | 63.04 | 63.40 | 63.04 | 61.97 | | 65.67 | 72.47 | 78.92 | 73.65 | 73.59 |
| (filler) Hisile | Silica | 8.80 | 8.60 | 8.65 | 8.60 | 8.45 | 7.08 | 8.96 | 2.29 | 2.49 | 2.33 | 2.32 |
| Aztech Tmch 40 | Peroxide. Similar to lupersol 231 [1,1-bis(t-butyl peroxy) 3,3,5-trimethyl cyclohexane]. Slightly more reactive than lupersol TBEC. | 0.59 | 0.57 | 0.58 | 0.57 | 0.56 | 0.47 | 0.60 | 0.76 | 0.83 | 0.78 | 0.77 |
| Tinuvin 234 | UV Absorber | | 0.57 | | | 0.56 | 0.47 | 0.60 | 0.76 | | | 0.77 |
| Tinuvin 770 | HALS | 0.59 | 0.57 | 0.58 | 0.57 | 0.56 | 0.47 | 0.60 | 0.76 | | | 0.77 |
| Chimasorb 944 | HALS/Antioxidant | 0.59 | 0.57 | 0.58 | 0.57 | 0.56 | 0.47 | 0.60 | 0.76 | | | 0.77 |
| Silane 172 | Silane Coupling agent, vinyl tri(2methoxy-ethoxy)silane | 0.29 | 0.29 | 0.29 | 0.29 | 0.28 | | 0.30 | 0.07 | 0.07 | 0.07 | 0.07 |
| TiO2 | | | | | | | | | 3.05 | | 3.10 | |
| (Zinc Diacrylate) SR 705 | No additives like with the Sartomer | 17.60 | 17.19 | 17.29 | 17.19 | 16.90 | 14.15 | 17.91 | 19.07 | 16.61 | 19.38 | 19.37 |
| (Amine) Octamin Flake | Octylated Diphenyl Amine 4,4'-dioctyldiphenylamine | | | | | | | | | 0.25 | | 0.77 |
| (250) oxidised Black | | 1.17 | 2.87 | 2.88 | 2.87 | 2.82 | 2.36 | 2.99 | | | | 0.77 |
| ZnO | | | | | | | | | | 0.60 | 0.56 | |
| Steric Acid | Processing aid | | | | | | | | | 0.15 | 0.14 | |
| Tinuvin 328 | | | | | | | | | | 0.07 | | |
| Chimasorb 119 | HALS | | | | | | | | | | | |
| Antioxidant 58 | Zinc salt of 2 mercapto-4-5-methyl bnzimidazole. Heat Stabilizer. | | | | | | | | | | | |
| Trielene 67 | liquid EPDM 11% unsaturated. Mz = 7700 | | 5.73 | | | | 22.64 | | | | | |
| Butene 1900 | oil | | | | | | | | | | | |
| Sartomer 75 EP2A | anti scorch agent yellow. | | | | | | | | | | | |
| Vulcup 40 KE | 40% active | | | | | 2.82 | | | | | | |
| indopol H100 | Low Molecular Weight Butene | | | | | | | | | | | |
| | liquid Metallic acrylate (proprietary); acrylate easter(CASRN proprietary); alcohol(CASRN proprietary) | | | | | | | | | | | |
| NC2403@ hallbond @ RX-13977 | dimer ester, hexamethy melamine | 5.87 | | 5.76 | 4.58 | 2.82 | | | | | | |
| poly fill (aluminum silicate) | talc | | | | | | | | | | | |
| molecular sieve | crushed zeolites | | | | | | | | | | | |
| HP#11 | Aliphatic fatty acid | | | | | 1.69 | | 1.79 | | | | |
| paraffinic oil sun2280 minstron vapor(talc) | | | | | 1.72 | | | | | | | |
| Black HAF 330 | | | | | | | | | | | | |
| N650(Black) | | | | | | | | | | | | |
| Trilene77 | | | | | | | | | | | | |
| EP57F | | | | | | | | | | | | |

TABLE I-continued

Example Compositions

| Ingredient | Number Comment | 78 Percent | 79 Percent | 80 Percent | 81 Percent | 82 Percent | 83 Percent | 84 Percent | 85 Percent | 86 Percent | 87 Percent | 88 Percent | 89 Percent | 90 Percent | 91 Percent |
|---|---|---|---|---|---|---|---|---|---|---|---|---|---|---|---|
| KEP281F | Very high MW EPDM, Mn = 85,000, Mw = 230,000, Mz = 62,000, PDI = 2.7 | | 41.41 | 13.93 | 66.47 | | | | | | | | | | |
| EP 33 | Higher molecular weight polymer for reduced tack. 8 to 9% unsaturation. Mn = 41,000, Mw-166,000, Mz = 630,000, Mw/Mn = 4.0 | 52.01 | 10.35 | 41.78 | | 73.08 | 58.05 | 64.52 | 74.25 | 78.05 | 63.40 | | 59.95 | 59.95 | 68.54 |
| (filler) Hisile | Silica | 11.82 | 7.06 | 8.36 | 9.06 | 2.31 | 7.92 | 8.80 | 6.96 | 7.32 | 8.65 | | 8.17 | 8.17 | 9.35 |
| Aztech Tmch 40 | Peroxide. Similar to lupersol 231 [1,1-bis(t-butyl peroxy) 3,3,5-trimethyl cyclohexane]. Slightly more reactive than lupersol TBEC. | 0.47 | 0.47 | 0.56 | 0.60 | 0.77 | 0.53 | 0.59 | 0.46 | 0.49 | 0.58 | | 0.54 | 0.54 | 0.62 |
| Tinuvin 234 | UV Absorber | | 0.47 | 0.56 | 0.60 | | | | | | | | | | |
| Tinuvin 770 | HALS | 0.47 | 0.47 | 0.56 | 0.60 | 0.38 | 0.53 | 0.59 | 0.46 | 0.49 | 0.58 | | 0.54 | 0.54 | 0.62 |
| Chimasorb 944 | HALS/Antioxidant | 0.47 | 0.47 | 0.56 | 0.60 | 0.38 | 0.53 | 0.59 | 0.46 | 0.49 | 0.58 | | 0.54 | 0.54 | 0.62 |
| Silane 172 | Silane Coupling agent, vinyl tri(2methoxy-ethoxy)silane | 0.24 | 0.24 | 0.28 | 3.02 | 0.07 | 0.26 | 0.29 | 0.23 | | 0.29 | | 0.27 | 0.27 | 0.31 |
| TiO2 | | | | | | | | | | | | | 2.72 | | |
| (Zinc Diacrylate) SR 705 | No additives like with the Sartomer | 11.82 | 14.12 | 16.71 | 18.13 | 19.23 | 15.83 | 17.60 | 11.60 | | 17.29 | | 16.35 | 16.35 | 18.69 |
| (Amine) Octamin Flake (250) oxidised Black | Octylated Diphenyl Amine 4,4'-dioctyldiphenylamine | | 2.35 | 2.79 | 1.51 | 3.08 | 2.64 | 1.17 | 0.93 | 0.98 | 2.88 | | | 2.72 | 1.25 |
| ZnO | | | | | | 0.55 | | | | | | | | | |
| Steric Acid | Processing aid | | | | | 0.14 | | | | | | | | | |
| Tinuvin 328 | | | | | | | | | | | | | | | |
| Chimasorb 119 | HALS | | | | | | | | | | | | | | |
| Antioxidant 58 | Zinc salt of 2 mercapto-4-5-methyl bnzimidazole. Heat Stabilizer. | | | | | | | | | | | | | | |
| Trilene 67 | liquid EPDM 11% unsaturated. Mz = 7700 | 22.70 | 22.59 | 13.93 | | | 8.44 | | | | | | | | |
| Butene 1900 | oil | | | | | | | | | | | | | | |
| Sartomer 75 EP2A | anti scorch agent yellow. | | | | | | 5.28 | 5.87 | 4.64 | | 2.88 | | 8.17 | 8.17 | |
| Vulcup 40 KE | 40% active | | | | | | | | | 12.20 | | | | | |
| indopol H100 | Low Molecular Weight Butene | | | | | | | | | | | | | | |
| NC2403@ | liquid Metallic acrylate (propritary); acrylate easter(CASRN proprietary); alcohol(CASRN proprietary) | | | | | | | | | | 2.88 | | 2.72 | 2.72 | |
| hallbond @ RX-13977 | dimer ester, hexamethy melamine | | | | | | | | | | | | | | |
| poly fill (aluminum silicate) | talc | | | | | | | | | | | | | | |
| molecular sieve | crushed zeolites | | | | | | | | | | | | | | |
| HP#11 | Aliphatic fatty acid | | | | | | | | | | | | | | |
| paraffinic oil sun2280 | | | | | | | | | | | | | | | |
| minstron vapor(talc) | | | | | | | | | | | | | | | |
| Black HAF 330 | | | | | | | | | | | | | | | |
| N650(Black) | | | | | | | | | | | | | | | |
| Trilene77 | | | | | | | | | | | | | | | |
| EP57F | | | | | | | | | | | | | | | |

We claim:

1. A composition which, when applied to a substrate and cured, provides a substantially water impervious coating on the substrate, comprising:
    an effective amount of a high molecular weight polymeric material;
    an effective amount of a curing agent;
    an inorganic compound;
    an effective amount of a coupling agent; and
    an effective amount of an antioxidant;
    wherein the effective amount of an antioxidant is an amount up to about 3% by weight of the total composition, and
    wherein the antioxidant comprises one or more hindered-amine light stabilizers.

2. The composition of claim 1, wherein the effective amount of the high molecular weight polymeric material is present in the composition in an amount from about 40% to about 95% by weight of the total composition.

3. The composition of claim 1, wherein the effective amount of the high molecular weight polymeric material is present in the composition in an amount from about 60% to about 80% by weight of the total composition.

4. The composition of claim 1, wherein the effective amount of the high molecular weight polymeric material is present in the composition in an amount of about 65% by weight of the total composition.

5. The composition of claim 1, wherein the high molecular weight polymeric material is an ethylene-propylene polymeric material.

6. The composition of claim 5, wherein the ethylene-propylene polymeric material is a randomly polymerized mixture of individual units of ethylene and propylene.

7. The composition of claim 6, wherein the ethylene-propylene polymeric material is terpolymerized with at least one diene molecule to form an ethylene-propylene-diene molecule.

8. The composition of claim 7, wherein the diene molecule is selected from the group consisting of ethylidene nobornene, dicyclopentadiene, butadiene, 1,4hexadiene and combinations thereof.

9. The composition of claim 1, wherein the effective amount of the curing agent is in an amount from about 0.1 to about 3% by weight of the total composition.

10. The composition of claim 1, where the curing agent is a radical producing curing agent.

11. The composition of claim 10, wherein the radical producing curing agent is a peroxide.

12. The composition of claim 11, wherein the peroxide is selected from the group consisting of diacyl peroxides, dialkyl peroxides, diperoxyketals, ketone peroxides, peroxydicarbonates, peroxyesters, and combinations thereof.

13. The composition of claim 11, wherein the peroxide is selected from the group consisting of tert-butyl-peroxy-2-ethylhexylcarbonate, OO-(t-butyl) O-(2-ethylhexyl) monoperoxycarbonate, benzoyl peroxide, dicumyl peroxide, a-a'-bis (t-butylperoxy)diisopropylbenzene (Vulcup), 1,1-di(t-butylperoxy)-3,3,5-trimethylcyclohexane, t-butylperoxy-diisopropyl benzene 2,5-dimethyl-2,5-di(t-butylperoxy) hexane and combinations thereof.

14. The composition of claim 11, wherein the peroxide is 1,1-di(t-butylperoxy)-3,3,5-trimethylcyclohexane.

15. The composition of claim 10, wherein the radical producing curing agent is an azide.

16. The composition of claim 1, wherein the inorganic compound is present in the composition in an amount of from about 1% to about 25% by weight of the total composition.

17. The composition of claim 1, wherein the inorganic compound is selected from the group consisting of silica, titanium dioxide, barium sulfate, talc, carbon black, clay, limestone, and combinations thereof.

18. The composition of claim 1, wherein the composition further comprises an adhesion promoting agent in an amount from about 0.05% to about 2% by weight of the total composition.

19. The composition of claim 18, where the adhesion promoting agent is an unsaturated alkoxy silane.

20. The composition of claim 18, wherein the adhesion promoting agent is an alkoxy silane selected from the group consisting of bis-trialkoxy silanes, amino-alkoxy silanes, phenyl alkoxy silanes, methoxy alkyl silanes, ethoxy alkyl silanes, and combinations thereof.

21. The composition of claim 19, wherein the alkoxy silane is selected from the group consisting of glycidoxypropyltrimethoxy silane, phenyltriethoxy silane, vinyl trimethoxy silane, vinylbenzylated aminoethylaminopropyltrimethoxy silane, g-methacryloxypropyltrimethoxy silane, and combinations thereof.

22. The composition of claim 1, further comprising an effective amount of a coupling coagent.

23. The composition of claim 22, wherein the coupling coagent is present in the composition in an amount up to about 30% by weight of the total composition.

24. The composition according to claim 1, wherein the coupling agent comprises a diacrylate.

25. The composition according to claim 24, wherein the diacrylate comprises zinc diacrylate.

26. The composition of claim 1, further comprising an effective amount of a colorant.

27. The composition of claim 1, wherein each of the one or more hindered-amine light stabilizers is selected from the group consisting of Tinuvin 770 [bis(2,2,6,6-tetramethyl-4-piperidinyl)sebacate], Chimassorb 944 {Poly[[6-[(1,1,3,3-tetramethylbutyl)amino]-s-triazine-2,4-diyl]-[(2,2-,6,6-tetramethyl-4-piperidyl)imino]-hexamethylene-[(2,2,6,6-tetramethyl-4-piperidyl)iminolli, Tinuvin 123 [Decanedioic acid, bis(2,2,6,6-tetramethyl-1-(octyloxy)-4-piperidinyl)ester], Chimassorb 119 {1,3,5-Triazine-2,4,6-triamine, N,N'''-[1,2-ethanediylbis[[[4.6-bis[butyl(-1,2,2,6,6-pentamethyl-4-piperidinyl)amino]-1,3,5-triazine-2-yl]imino]-3,1propanediyl]]-bis[N',N''-dibutyl-N',N''-bis(1,2,2,6,6-pentamethyl-4-piperid-inyl)-}, and combinations thereof.

28. A composition suitable for encapsulation of photovoltaic components and which, when applied to a substrate and cured, provides UV stability, electrical insulation, mechanical protection, low tack, and corrosion protection, comprising:
    a high molecular weight polymeric material in an amount from about 40% to about 95% by weight of the total composition;
    a curing agent in an amount from about 0.1% to about 3% by weight of the total composition;
    an inorganic compound in an amount up to about 35% by weight of the total composition;
    a coupling agent in an amount from about 0.09% to about 5% by weight of the total composition;
    a processing aid in an amount up to about 50% by weight of the total composition;
    an adhesion promoting agent in an amount from about 0.05% to about 2% by weight of the total composition; and
    an effective amount of an antioxidant;

wherein the effective amount of an antioxidant is an amount up to about 3% by weight of the total composition, and wherein the antioxidant comprises one or more hindered-amine light stabilizers.

29. A photovoltaic module, comprising:

a glass plate;

photovoltaic cell circuitry; and an encapsulant composition bonded to a portion of the glass plate and encapsulating at least a portion of the photovoltaic cell circuitry, the encapsulant composition comprising an effective amount of a high molecular weight polymeric material, an effective amount of a curing agent, an inorganic compound, an effective amount of a coupling agent, and an effective amount of an antioxidant;

wherein the effective amount of an antioxidant is an amount up to about 3% by weight of the total composition, and wherein the antioxidant comprises one or more hindered-amine light stabilizers.

* * * * *